US010586786B2

(12) United States Patent
DeLaCruz et al.

(10) Patent No.: US 10,586,786 B2
(45) Date of Patent: *Mar. 10, 2020

(54) 3D CHIP SHARING CLOCK INTERCONNECT LAYER

(71) Applicant: Xcelsis Corporation, San Jose, CA (US)

(72) Inventors: Javier DeLaCruz, San Jose, CA (US); Steven L. Teig, Menlo Park, CA (US); Ilyas Mohammed, San Jose, CA (US); Eric M. Nequist, Saratoga, CA (US)

(73) Assignee: Xcelsis Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/976,821

(22) Filed: May 10, 2018

(65) Prior Publication Data

US 2018/0350775 A1 Dec. 6, 2018

Related U.S. Application Data

(63) Continuation-in-part of application No. 15/725,030, filed on Oct. 4, 2017.
(Continued)

(51) Int. Cl.
*H01L 21/30* (2006.01)
*H01L 25/065* (2006.01)
*H01L 23/00* (2006.01)

(52) U.S. Cl.
CPC .......... *H01L 25/0657* (2013.01); *H01L 24/05* (2013.01); *H01L 24/06* (2013.01);
(Continued)

(58) Field of Classification Search
CPC ............... H01L 21/8221; H01L 23/481; H01L 23/49827; H01L 23/5225; H01L 23/5286;
(Continued)

(56) References Cited

U.S. PATENT DOCUMENTS 5,016,138 A 5/1991 Woodman
5,579,207 A 11/1996 Hayden et al.
(Continued)

FOREIGN PATENT DOCUMENTS

WO 2019079625 A1 4/2019
WO 2019079631 A1 4/2019

OTHER PUBLICATIONS

Author Unknown, "Fact Sheet: New Intel Architectures and Technologies Target Expanded Market Opportunities," Dec. 12, 2018, 9 pages, Intel Corporation, Santa Clara, California.
(Continued)

*Primary Examiner* — Brook Kebede
(74) *Attorney, Agent, or Firm* — Adeli LLP

(57) ABSTRACT

Some embodiments of the invention provide a three-dimensional (3D) circuit that is formed by stacking two or more integrated circuit (IC) dies to at least partially overlap and to share one or more interconnect layers that distribute power, clock and/or data-bus signals. The shared interconnect layers include interconnect segments that carry power, clock and/or data-bus signals. In some embodiments, the shared interconnect layers are higher level interconnect layers (e.g., the top interconnect layer of each IC die). In some embodiments, the stacked IC dies of the 3D circuit include first and second IC dies. The first die includes a first semiconductor substrate and a first set of interconnect layers defined above the first semiconductor substrate. Similarly, the second IC die includes a second semiconductor substrate and a second set of interconnect layers defined above the second semiconductor substrate. As further described below, the first and second dies in some embodiments are placed in a face-to-face arrangement (e.g., a vertically stacked arrangement) that has the first and second set of interconnect layers facing each other. In some embodiments, a subset of one or more interconnect layers of the second set interconnect layers of the second die has interconnect wiring that carries power, clock and/or data-bus signals that are supplied to the first IC die.

24 Claims, 25 Drawing Sheets

Related U.S. Application Data

(60) Provisional application No. 62/619,910, filed on Jan. 21, 2018, provisional application No. 62/575,184, filed on Oct. 20, 2017, provisional application No. 62/575,240, filed on Oct. 20, 2017, provisional application No. 62/575,259, filed on Oct. 20, 2017, provisional application No. 62/405,833, filed on Oct. 7, 2016.

(52) U.S. Cl.
CPC .............. *H01L 24/08* (2013.01); *H01L 24/09* (2013.01); *H01L 24/80* (2013.01); *H01L 2224/05541* (2013.01); *H01L 2224/0603* (2013.01); *H01L 2224/08146* (2013.01); *H01L 2224/0903* (2013.01); *H01L 2224/80895* (2013.01); *H01L 2224/80896* (2013.01); *H01L 2224/80905* (2013.01); *H01L 2225/06524* (2013.01); *H01L 2225/06565* (2013.01); *H01L 2924/381* (2013.01)

(58) Field of Classification Search
CPC ......... H01L 24/03; H01L 24/05; H01L 24/08; G11C 5/04; G11C 11/4093; G11C 11/4096
USPC ......................................................... 438/455
See application file for complete search history.

(56) References Cited

U.S. PATENT DOCUMENTS

| | | |
|---|---|---|
| 5,673,478 A | 10/1997 | Beene et al. |
| 6,707,124 B2 | 3/2004 | Wachtler et al. |
| 6,909,194 B2 | 6/2005 | Farnworth et al. |
| 7,046,522 B2 | 5/2006 | Sung et al. |
| 7,638,869 B2 | 12/2009 | Irsigler et al. |
| 7,692,946 B2 | 4/2010 | Taufique et al. |
| 8,032,711 B2 | 10/2011 | Black et al. |
| 8,110,899 B2 | 2/2012 | Reed et al. |
| 8,148,814 B2 | 4/2012 | Furuta et al. |
| 8,516,409 B2 | 8/2013 | Coteus et al. |
| 8,546,955 B1 | 10/2013 | Wu |
| 8,547,769 B2 | 10/2013 | Saraswat et al. |
| 8,704,384 B2 | 4/2014 | Wu et al. |
| 8,736,068 B2 | 5/2014 | Bartley et al. |
| 8,797,818 B2 | 8/2014 | Jeddeloh |
| 8,816,506 B2 | 8/2014 | Kawashita et al. |
| 8,860,199 B2 | 10/2014 | Black et al. |
| 8,907,439 B1 | 12/2014 | Kay et al. |
| 8,930,647 B1 | 1/2015 | Smith |
| 9,067,272 B2 | 6/2015 | Sutanto et al. |
| 9,076,700 B2 | 7/2015 | Kawashita et al. |
| 9,318,418 B2 | 4/2016 | Kawashita et al. |
| 9,478,496 B1 | 10/2016 | Lin |
| 9,497,854 B2 | 11/2016 | Giuliano |
| 9,501,603 B2 | 11/2016 | Barowski et al. |
| 9,640,233 B2 | 5/2017 | Sohn |
| 9,645,603 B1 | 5/2017 | Chall et al. |
| 9,647,187 B1 | 5/2017 | Yap et al. |
| 9,691,739 B2 | 6/2017 | Kawashita et al. |
| 9,746,517 B2 | 8/2017 | Whetsel |
| 9,915,978 B2 | 3/2018 | Dabby et al. |
| 10,255,969 B2 | 4/2019 | Eom et al. |
| 10,262,911 B1 | 4/2019 | Gong et al. |
| 10,269,586 B2 | 4/2019 | Chou et al. |
| 10,373,657 B2 | 8/2019 | Kondo et al. |
| 10,446,207 B2 | 10/2019 | Kim et al. |
| 2001/0017418 A1 | 8/2001 | Noguchi et al. |
| 2005/0127490 A1 | 6/2005 | Black et al. |
| 2007/0220207 A1 | 9/2007 | Black et al. |
| 2009/0070727 A1 | 3/2009 | Solomon |
| 2010/0140750 A1 | 6/2010 | Toms |
| 2012/0201068 A1* | 8/2012 | Ware .................. G11O 5/04 365/63 |
| 2013/0051116 A1 | 2/2013 | En et al. |
| 2013/0187292 A1* | 7/2013 | Semmelmeyer .... H01L 25/0652 257/777 |
| 2013/0207268 A1 | 8/2013 | Chapelon |
| 2013/0275823 A1 | 10/2013 | Cordero et al. |
| 2014/0022002 A1 | 1/2014 | Chua-Eoan et al. |
| 2015/0228584 A1 | 8/2015 | Huang et al. |
| 2016/0111386 A1 | 4/2016 | England et al. |
| 2016/0225431 A1 | 8/2016 | Best et al. |
| 2016/0233134 A1 | 8/2016 | Lim et al. |
| 2016/0329312 A1 | 11/2016 | O'Mullan et al. |
| 2016/0379115 A1 | 12/2016 | Burger et al. |
| 2017/0092615 A1 | 3/2017 | Oyamada |
| 2017/0092616 A1 | 3/2017 | Su et al. |
| 2017/0148737 A1 | 5/2017 | Fasano et al. |
| 2017/0213787 A1 | 7/2017 | Alfano et al. |
| 2017/0278213 A1 | 9/2017 | Eckert et al. |
| 2017/0301625 A1 | 10/2017 | Mahajan et al. |
| 2018/0286800 A1 | 10/2018 | Kamal et al. |
| 2018/0330992 A1 | 11/2018 | Delacruz et al. |
| 2018/0330993 A1 | 11/2018 | Delacruz et al. |
| 2018/0331037 A1 | 11/2018 | Mohammed et al. |
| 2018/0331038 A1 | 11/2018 | Delacruz et al. |
| 2018/0331072 A1 | 11/2018 | Nequist et al. |
| 2018/0331094 A1 | 11/2018 | Delacruz et al. |
| 2018/0331095 A1 | 11/2018 | Delacruz et al. |
| 2019/0042377 A1 | 2/2019 | Teig et al. |
| 2019/0042912 A1 | 2/2019 | Teig et al. |
| 2019/0042929 A1 | 2/2019 | Teig et al. |
| 2019/0043832 A1 | 2/2019 | Teig et al. |
| 2019/0051641 A1 | 2/2019 | Lee et al. |
| 2019/0123022 A1 | 4/2019 | Teig et al. |
| 2019/0123023 A1 | 4/2019 | Teig et al. |
| 2019/0123024 A1 | 4/2019 | Teig et al. |
| 2019/0244933 A1 | 8/2019 | Or-Bach et al. |

OTHER PUBLICATIONS

Author Unknown, "Vector Supercomputer SX Series: SX-Aurora Tsubasa," Oct. 2017, 2 pages, NEC Corporation.
Bansal, Samta, "3D-IC is Now Real: Wide-IO is Driving 3D-IC TSV," Cadence Flash Memory Summit, Aug. 2012, 14 pages, Cadence Design Systems, Inc.
Black, Bryan, "Die Stacking is Happening!," Dec. 9, 2013, 53 pages, Advanced Micro Devices, Inc., Santa Clara, California.
Black, Bryan, et al., "3D Processing Technology and its Impact on iA32 Microprocessors," Proceedings of 2004 IEEE International Conference on Computer Design: VLSI in Computers and Processors, Oct. 11-13, 2004, 3 pages, IEEE, San Jose, California.
Black, Bryan, et al, "Die Stacking (3D) Microarchitecture," Proceedings of the 39th Annual IEEE/ACM International Symposium on Microarchitecture, Dec. 9-13, 2006, 11 pages, IEEE, Orlando, Florida.
Hajkazemi, Mohammad Hossein, et al., "Wide I/O or LPDDR? Exploration and Analysis of Performance, Power and Temperature Trade-offs of Emerging DRAM Technologies in Embedded MPSoCs," Proceedings of 33rd IEEE International Conference on Computer Design (ICCD), Oct. 18-21, 2015, 8 pages, IEEE, New York City, New York.
Invitation to Pay Additional Fees for Commonly Owned International Patent Application PCT/US2018/056559 dated Feb. 7, 2019, 15 pages, International Searching Authority (EPO).
Invitation to Pay Additional Fees for Commonly Owned International Patent Application PCT/US2018/056565 dated Feb. 12, 2019, 13 pages, International Searching Authority (EPO).
Kim, Jung-Sik, et al., "A 1.2 V 12.8 GB/s 2 Gb Mobile Wide-I/O DRAM With 4×128 I/Os Using TSV Based Stacking," IEEE Journal of Solid-State Circuits, Jan. 2012, 10 pages, vol. 47, No. 1, IEEE.
Loh, Gabriel H., et al., "Processor Design in 3D Die-Stacking Technologies," IEEE Micro, May/Jun. 2007, 18 pages, vol. 27, Issue 3, IEEE Computer Society.
Nakamoto, Mark, et al., "Simulation Methodology and Flow Integration for 3D IC Stress Management," 2010 IEEE Custom Integrated Circuits Conference, Sep. 19-22, 2010, 4 pages, IEEE, San Jose, CA, USA.

(56) References Cited

OTHER PUBLICATIONS

Tran, Kevin, et al., "Start Your HBM/2.5D Design Today," High-Bandwidth Memory White Paper, Mar. 29, 2016, 6 pages, Amkor Technology, Inc., San Jose, CA, USA.

Wu, Xiaoxia, et al., "Electrical Characterization for Intertier Connections and Timing Analysis for 3-D ICs," IEEE Transactions on Very Large Scale Integration (VLSI) Systems, Dec. 6, 2010, 5 pages, IEEE.

\* cited by examiner

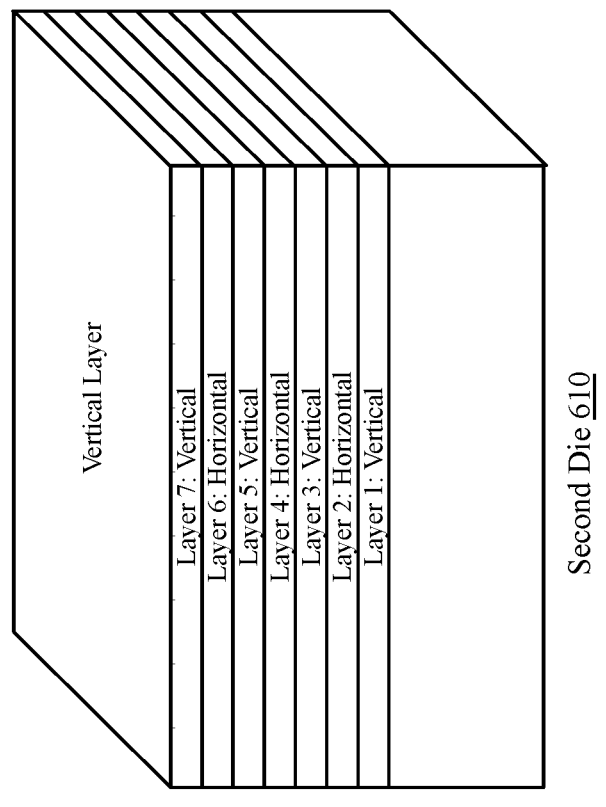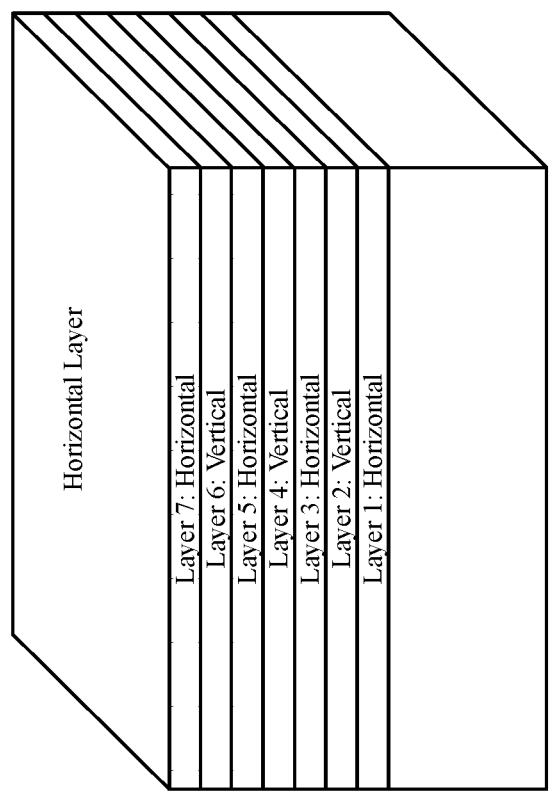
Figure 6

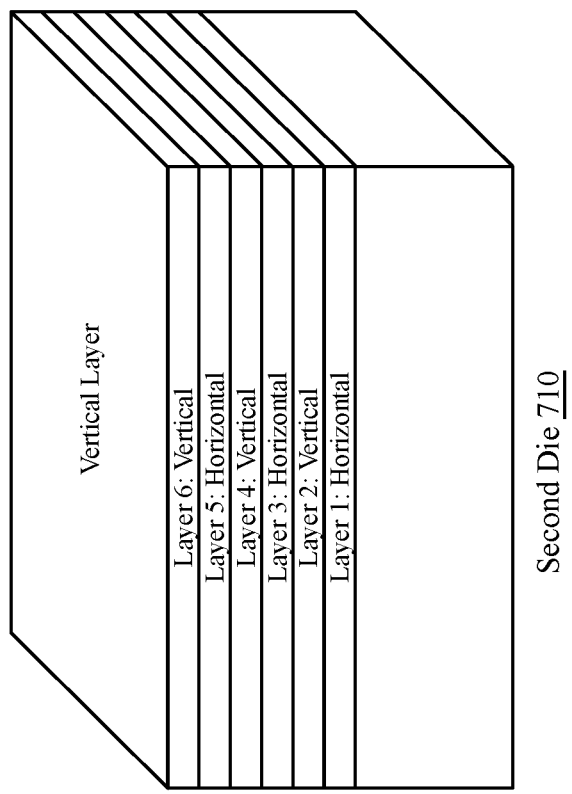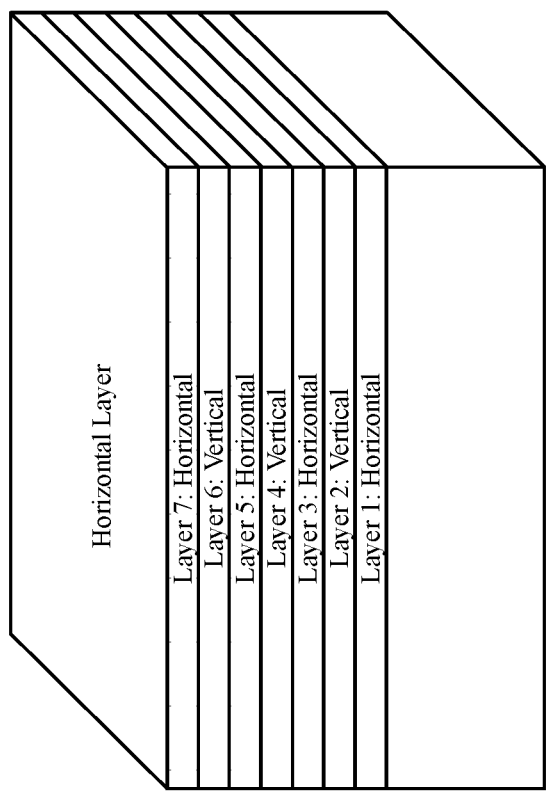
Figure 7

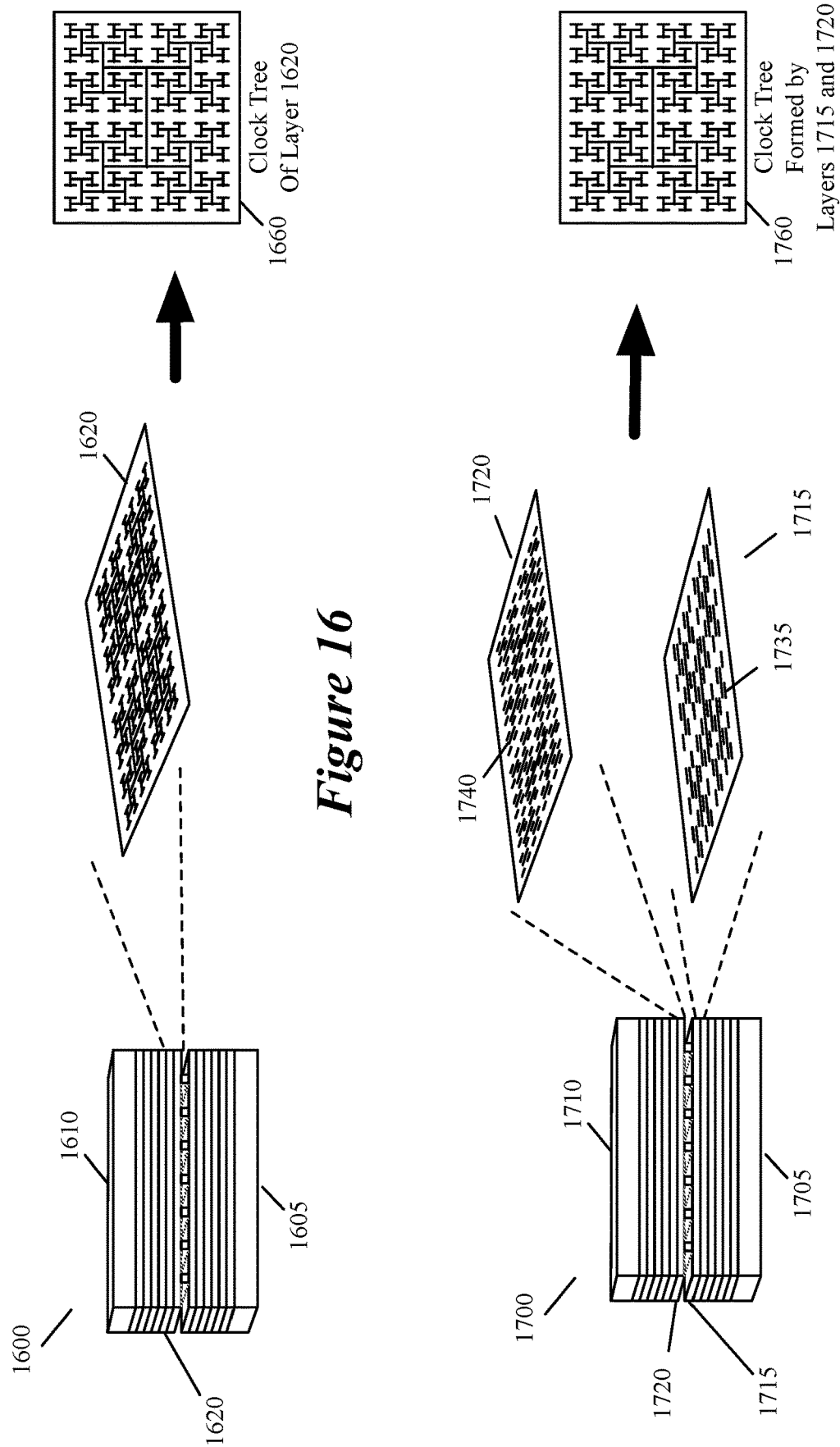

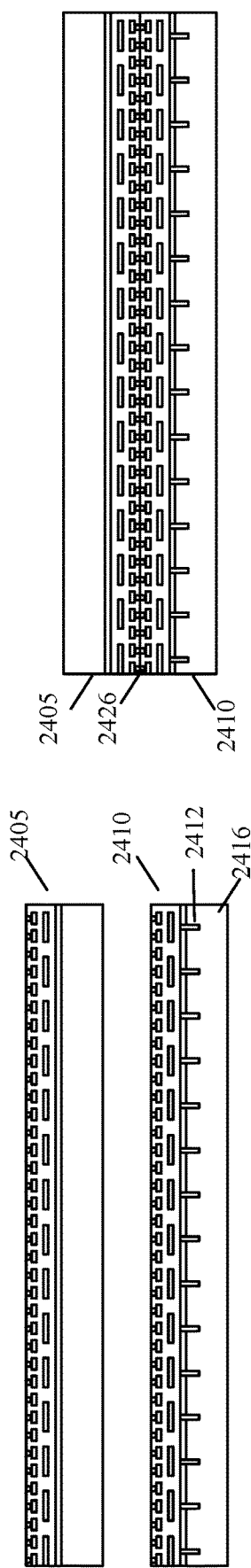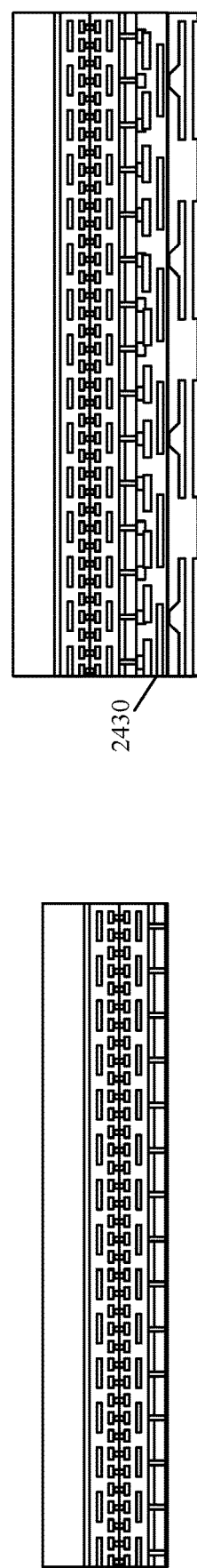
*Figure 24*
*Figure 25*
*Figure 26*
*Figure 27*

3D CHIP SHARING CLOCK INTERCONNECT LAYER

BACKGROUND

Electronic circuits are commonly fabricated on a wafer of semiconductor material, such as silicon. A wafer with such electronic circuits is typically cut into numerous dies, with each die being referred to as an integrated circuit (IC). Each die is housed in an IC case and is commonly referred to as a microchip, "chip," of IC chip. According to Moore's law (first proposed by Gordon Moore), the number of transistors that can be defined on an IC die will double approximately every two years. With advances in semiconductor fabrication processes, this law has held true for much of the past fifty years. However, in recent years, the end of Moore's law has been prognosticated as we are reaching the maximum number of transistors that can possibly be defined on a semiconductor substrate. Hence, there is a need in the art for other advances that would allow more transistors to be defined in an IC chip.

BRIEF SUMMARY

Some embodiments of the invention provide a three-dimensional (3D) circuit that is formed by stacking two or more integrated circuit (IC) dies to at least partially overlap and to share one or more interconnect layers that distribute power, clock and/or data-bus signals. The shared interconnect layers include interconnect segments (also referred to as interconnect lines or wires) that carry power, clock and/or data-bus signals. In some embodiments, the shared interconnect layers are higher level interconnect layers (e.g., the top interconnect layer of each IC die).

In some embodiments, the stacked IC dies of the 3D circuit include first and second IC dies. The first die includes a first semiconductor substrate and a first set of interconnect layers defined above the first semiconductor substrate. Similarly, the second IC die includes a second semiconductor substrate and a second set of interconnect layers defined above the second semiconductor substrate. As further described below, the first and second dies in some embodiments are placed in a face-to-face arrangement (e.g., a vertically stacked arrangement) that has the first and second set of interconnect layers facing each other. In some embodiments, a subset of one or more interconnect layers of the second set interconnect layers of the second die has interconnect wiring that carries power, clock and/or data-bus signals that are supplied to the first IC die. This subset is referred to below as the shared interconnect-layer subset.

In some embodiments, numerous electronic components (e.g., active components, like transistors and diodes, or passive components, like resistors and capacitors) are defined on the first semiconductor substrate, and these electronic components are connected to each other through interconnect wiring on the first set of interconnect layers to form numerous microcircuits (e.g., Boolean gates) and/or larger circuits (e.g., functional blocks). In some of these embodiments, the power, clock and/or data-bus signals from the shared interconnect-layer subset of the second die are supplied to several electronic components, microcircuits, and larger circuits of the first die. Also, in some of these embodiments, the power, clock and/or data-bus signals from the shared interconnect-layer subset are also supplied to electronic components, microcircuits, and larger circuits that are formed on the second substrate of the second die.

In some embodiments, the face-to-face arranged first and second dies have their top interconnect layers bonded to each other through a direct bonding process that establishes direct-contact metal-to-metal bonding, oxide bonding, or fusion bonding between these two sets of interconnect layers. An example of such bonding is copper-to-copper (Cu-Cu) metallic bonding between two copper conductors in direct contact. In some embodiments, the direct bonding is provided by a hybrid bonding technique such as DBI® (direct bond interconnect) technology, and other metal bonding techniques (such as those offered by Invensas Bonding Technologies, Inc., an Xperi Corporation company, San Jose, Calif.).

The direct bonding techniques of some embodiments allow a large number of direct connections (e.g., more than 1,000 connections/mm$^2$, 10,000 connections/mm$^2$, 100,000 connections/mm$^2$, 1,000,000 connections/mm$^2$ or less, etc.) to be established between the top two interconnect layers of the first and second dies, in order to allow power, clock and/or data-bus signals to traverse between the first and second IC dies. These connections traverse the bonding layer between the two face-to-face mounted dies. When these connections provide signals from the top interconnect layer of the second die to the top interconnect layer of the first die, the first die in some embodiments uses other IC structures (e.g., vias) to carry these signals from its top interconnect layer to other layers and/or substrate of the first die.

These connections between the top interconnect layers of the first and second IC dies are very short in length, which, as further described below, allows the signals on these lines to reach their destinations quickly while experiencing minimal capacitive load from other nearby wiring. In some embodiments, the pitch between two neighboring direct-bonded connections (i.e., the distance between the centers of the two neighboring connections) that connect the top interconnect layers of the first and second dies can be extremely small, e.g., the pitch for two neighboring connections can be between 0.2 µm to 15 µm. This close proximity allows for the large number and high density of such connections between the top interconnect layers of the first and second dies. Moreover, the close proximity of these connections does not introduce much capacitive load between two neighboring z-axis connections because of their short length and small interconnect pad size.

In some embodiments, the top interconnect layers of the first and second dies have preferred wiring directions that are orthogonal to each other. Specifically, the top interconnect layer of the first die has a first preferred routing direction, while the top interconnect layer of the second die has a second preferred routing direction. In some embodiments, the first and second preferred routing directions are orthogonal to each other, e.g., the top layer of one die has a horizontal preferred routing direction while the top layer of the other die has a vertical preferred routing direction. In other embodiments, the top layer of the first die has the same preferred routing direction as the top layer of the second die, but one of the two dies is rotated by 90 degrees before bonding the top two layers together through a direct bonding technique.

Having the wiring direction of the top interconnect layers of the first and second dies be orthogonal to each other has several advantages. It provides better signal routing between the IC dies and avoids capacitive coupling between long parallel segments on adjacent interconnect layers of the two dies. Also, it allows the top interconnect layers of the first and second dies to conjunctively define a power distribution network (referred to as power mesh below) or a clock distribution network (referred to below as clock tree) that requires orthogonal wire segments in two different interconnect layers.

Orthogonal wiring directions on the top layers of the first and second dies also increases the overlap between the wiring on these layers, which increases the number of candidate locations for bonding different pairs of wires on the top interconnect layers of the different dies to provide power signals and/or clock signals from one die to another die. For instance, in some embodiments, the first die has one set of alternating power and ground lines that traverses along one direction (e.g., the horizontal direction), while the second die has another set of alternating power and ground lines that traverses along another direction (e.g., the vertical direction). The power/ground lines on one die's interconnect layer can be directly bonded to corresponding power/ground lines on the other die's interconnect layer at each or some of the overlaps between corresponding pair of power lines.

This direct bonding creates a very robust power mesh for the first and second dies without using two different interconnect layers for each of these two dies. In other words, defining a power mesh by connecting orthogonal top interconnect layers of the first and second dies through a direct bonding scheme eliminates one or more of power layers in each die in some embodiments. Similarly, defining a clock tree by connecting orthogonal top interconnect layers of the first and second dies through a direct bonding scheme eliminates one or more of clock layers in each die in some embodiments. In other embodiments, the first die does not have a power mesh or clock tree, as it shares the power mesh or clock tree that is defined in the interconnect layer(s) of the second die.

The first and second dies in some embodiments are not face-to-face stacked. For instance, in some embodiments, these two dies are face-to-back stacked (i.e., the set of interconnect layers of one die is mounted next to the backside of the semiconductor substrate of the other die), or back-to-back stacked (i.e., the backside of the semiconductor substrate of one die is mounted next to the backside of the semiconductor substrate of the other die). In other embodiments, a third die is placed between the first and second dies, which are face-to-face stacked, face-to-back stacked (with the third die between the backside of the substrate of one die and the set of interconnect layers of the other die), or back-to-back stacked (with the third die between the backsides of the substrates of the first and second dies). While some embodiments use a direct bonding technique to establish connections between the top interconnect layers of two face-to-face stacked dies, other embodiments use alternative connection schemes (such as through silicon vias, TSVs, through-oxide vias, TOVs, or through-glass vias, TGVs) to establish connections between face-to-back dies and between back-to-back dies.

Stacking IC dies to share power, clock and/or data-bus signals between two dies has several advantages. This stacking reduces the overall number of interconnect layers of the two dies because it allows the two dies to share some of the higher-level interconnect layers in order to distribute power, clock and/or data-bus signals. For example, as described above, each die does not need to devote two interconnect layers to create a power/ground mesh, because this mesh can be formed by direct bonding the power/ground top interconnect layer of one die with the power/ground top interconnect layer of the other die. Reducing the higher-level interconnect layers is beneficial as the wiring on these layers often consume more space due to their thicker, wider and coarser arrangements. In addition, the ability to share the use of these interconnect layers on multiple dies may reduce the congestion and route limitations that may be more constrained on one die than another.

Stacking the IC dies in many cases also allows the wiring for delivering the power, clock and/or data-bus signals to be much shorter, as the stacking provides more candidate locations for shorter connections between power, clock and/or data-bus signal interconnects and the circuit components that are to receive these signals. For instance, instead of routing data-bus signals on the first die about several functional blocks in order to reach a circuit or component within another block from that block's periphery, the data-bus signals can be provided directly to that circuit or component on the first die from data-bus interconnect on a shared interconnect layer of the second die. The data signal can be provided to its destination very quickly (e.g., within 1 or 2 clock cycles) as it does not need to be routed from the destination block's periphery, but rather is provided by a short interconnect from the shared interconnect layer above. Shorter connections for power, clock and/or data-bus signals reduce the capacitive load on the connections that carry these signals, which, in turn, reduces the signal skew on these lines and allows the 3D circuit to use no or less signal isolation schemes.

Stacking the IC dies also allows the dies to share power, clock and/or data-bus circuits. For instance, in some embodiments in which the first die shares power, clock and/or data-bus interconnects of the second die, the first die also relies on power, clock and/or data-bus circuits that are defined on the second die to provide the power, clock and/or data-bus signals. This frees up space on the first die to implement other circuits and functional blocks of the 3D circuit. The resulting savings can be quite significant because power, clock and/or data-bus circuits can often consume a significant portion of available space. For example, chip input/output (I/O) circuits (e.g., SERDES I/O circuits) and memory I/O circuits (e.g., DDR memory I/O circuits) can be larger than many other circuits on an IC.

Pushing off all or some of the power and clock circuits from the first die to the second die also frees up space on the first die because often power and clock circuits need to be isolated from other circuits and/or signals that can affect the operation of the power and clock circuits. Also, having system level circuits on just one die allows for better isolation of such circuits (e.g., better isolation of voltage regulators and/or clock circuits).

In sum, stacking the IC dies optimizes the cost and performance of a chip stack system by combining certain functionalities into common interconnect layers and sharing these functions with multiple die in the stack. The functionalities provided by the higher-level interconnect layers can be shared with multiple dies in the stack. The higher-level interconnect layers require thicker and wider metal and coarser pitch. Removing them allows each chip to be connected with a few inner level interconnect layers with higher density vias to enable higher performance and lower cost. Examples of the high-level interconnect layers include system level circuitry layers, and RDL layers. The system circuits include power circuits, clock circuits, data bus circuits, ESD (electro-static discharge) circuits, test circuits, etc.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, the Drawings and the Claims is needed.

BRIEF DESCRIPTION OF THE DRAWINGS

The novel features of the invention are set forth in the appended claims. However, for purposes of explanation, several embodiments of the invention are set forth in the following figures.

FIGS. 6-8 illustrate examples of several techniques for ensuring that the preferred wiring directions of the top interconnect layers of the first and second dies are orthogonal to each other.

FIGS. 16-18 presents examples for sharing a clock tree between the two face-to-face mounted dies.

FIGS. 24-27 show two wafers at different stages of the fabrication process of FIG. 23.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments of the invention provide a three-dimensional (3D) circuit that is formed by vertically stacking two or more integrated circuit (IC) dies to at least partially overlap and to share one or more interconnect layers that distribute power, clock and/or data-bus signals. The shared interconnect layers include interconnect segments (also referred to as interconnect lines or wires) that carry power, clock and/or data-bus signals. In some embodiments, the shared interconnect layers are higher level interconnect layers.

Figure 1:
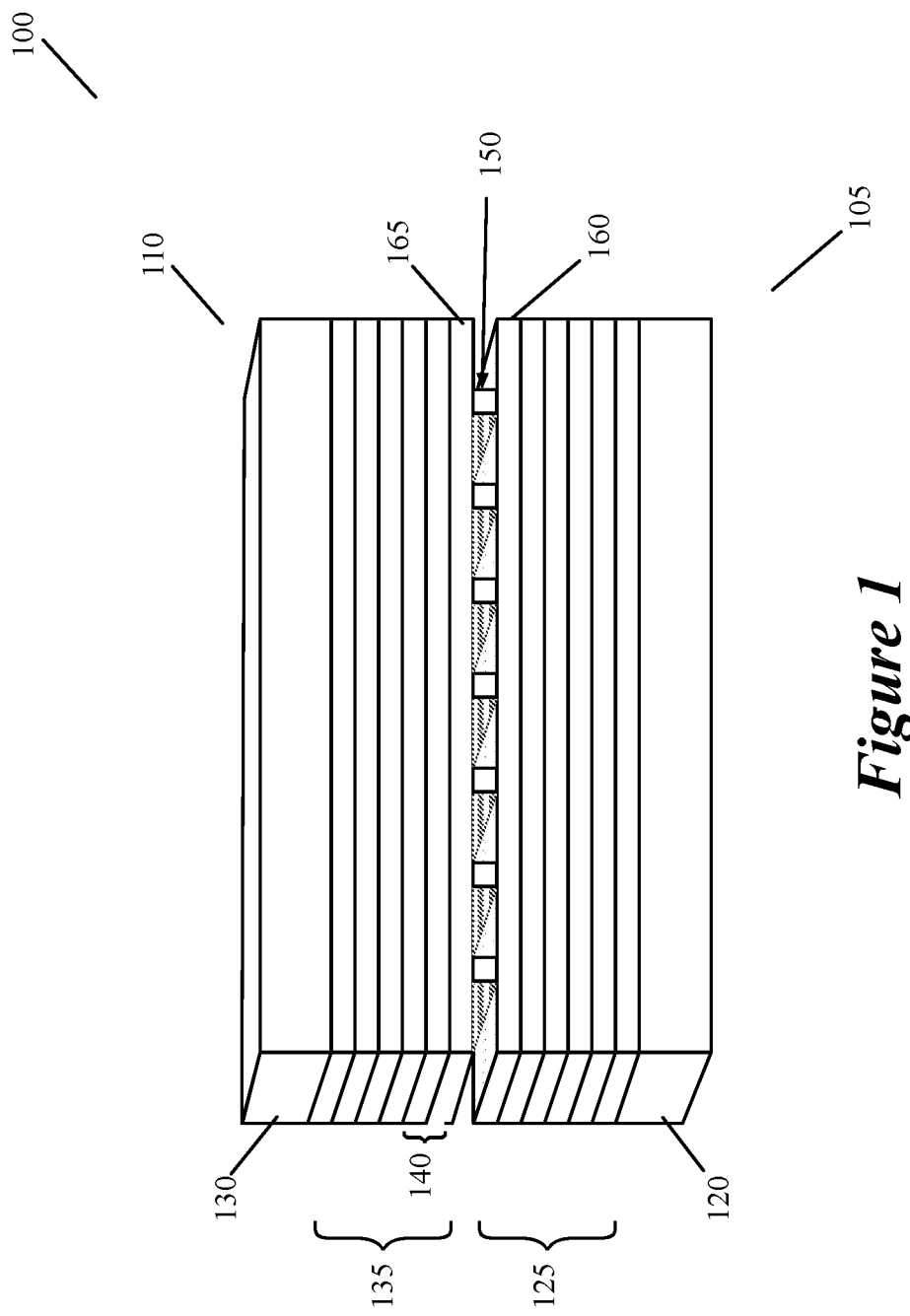
FIG. 1 illustrates a 3D circuit of some embodiments of the invention.

FIG. 1 illustrates a 3D circuit 100 of some embodiments of the invention. As shown, the circuit 100 includes two IC dies 105 and 110 that are in a vertically stacked, face-to-face arrangement. Although not shown in FIG. 1, the stacked first and second dies in some embodiments are encapsulated into one integrated circuit package by an encapsulating epoxy and/or a chip case. The first die 105 includes a first semiconductor substrate 120 and a first set of interconnect layers 125 defined above the first semiconductor substrate 120. Similarly, the second IC die 110 includes a second semiconductor substrate 130 and a second set of interconnect layers 135 defined above the second semiconductor substrate 130. In some embodiments, a subset 140 of one or more interconnect layers of the second set interconnect layers 135 of the second die has interconnect wiring that carries power, clock and/or data-bus signals that are supplied to the first IC die 105 (e.g., to the interconnect layers and/or substrate of the first die 105). This subset 140 is referred to below as the shared interconnect-layer subset.

In some embodiments, numerous electronic components (e.g., active components, like transistors and diodes, or passive components, like resistors and capacitors) are defined on the first semiconductor substrate 120 and on the second semiconductor substrate 130. The electronic components on the first substrate 120 are connected to each other through interconnect wiring on the first set of interconnect layers 125 to form numerous microcircuits (e.g., Boolean gates) and/or larger circuits (e.g., functional blocks). Similarly, the electronic components on the second substrate 130 are connected to each other through interconnect wiring on the second set of interconnect layers 135 to form additional microcircuits (e.g., Boolean gates) and/or larger circuits (e.g., functional blocks).

In some embodiments, the electronic components on one die's substrate (e.g., the first substrate 120 of the first die 105) are also connected to other electronic components on the same substrate (e.g., substrate 120) through interconnect wiring on the other die's set of interconnect layers (e.g., the second set of interconnect layers 135 of the second die 110) to form additional microcircuits and/or larger circuits.

In some embodiments, power, clock and/or data-bus signals from the shared interconnect-layer subset 140 of the second die 110 are supplied to several electronic components, microcircuits, and larger circuits of the first die 105. Also, in some of these embodiments, the power, clock and/or data-bus signals from the shared interconnect-layer subset 140 are also supplied to electronic components, microcircuits, and larger circuits that are formed on the second substrate of the second die 110.

To form the 3D circuit 100 of FIG. 1, the first and second dies are face-to-face stacked so that the first and second set of interconnect layers 125 and 135 are facing each other. The top interconnect layers 160 and 165 are bonded to each other through a direct bonding process that establishes direct-contact metal-to-metal bonding, oxide bonding, or fusion bonding between these two sets of interconnect layers. An example of such bonding is copper-to-copper (Cu-Cu) metallic bonding between two copper conductors in direct contact. In some embodiments, the direct bonding is provided by a hybrid bonding technique such as DBI® (direct bond interconnect) technology, and other metal bonding techniques (such as those offered by Invensas Bonding Technologies, Inc., an Xperi Corporation company, San Jose, Calif.). In some embodiments, DBI connects span across silicon oxide and silicon nitride surfaces.

The DBI process is further described in U.S. Pat. No. 6,962,835 and U.S. Pat. No. 7,485,968, both of which are incorporated herein by reference. This process is also described in U.S. patent application Ser. No. 15/725,030, which is also incorporated herein by reference. As described in U.S. patent application Ser. No. 15/725,030, the direct bonded connections between two face-to-face mounted IC dies are native interconnects that allow signals to span two different dies with no standard interfaces and no input/output protocols at the cross-die boundaries. In other words, the direct bonded interconnects allow native signals from one die to pass directly to the other die with no modification of the native signal or negligible modification of the native signal, thereby forgoing standard interfacing and consortium-imposed input/output protocols.

In this manner, the direct bonded interconnects allow circuits to be formed across and/or to be accessed through the cross-die boundary of two face-to-face mounted dies. Examples of such circuits are further described in U.S. patent application Ser. No. 15/725,030. The incorporated U.S. Pat. No. 6,962,835, U.S. Pat. No. 7,485,968, and U.S. patent application Ser. No. 15/725,030 also describe fabrication techniques for manufacturing two face-to-face mounted dies.

As shown in FIG. 1, the direct bonding techniques of some embodiments allow a large number of direct connections 150 to be established between the top interconnect layer 165 of the second die 110 and top interconnect layer 160 of the first die 105. For these signals to traverse to other interconnect layers of the first die 105 or to the substrate 120 of the first die 105, the first die in some embodiments uses other IC structures (e.g., vias) to carry these signals from its top interconnect layer to these other layers and/or substrate. In some embodiments, more than 1,000 connections/mm$^2$, 10,000 connections/mm$^2$, 100,000 connections/mm$^2$, 1,000,000 connections/mm$^2$ or less, etc. can be established between the top interconnect layers 160 and 165 of the first and second dies 105 and 110 in order to allow power, clock and/or data-bus signals to traverse between the first and second IC dies.

The direct-bonded connections 150 between the first and second dies are very short in length. For instance, based on current manufacturing technologies, the direct-bonded connections can range from a fraction of a micron to a single-digit or low double-digit microns (e.g., 2-10 microns). As further described below, the short length of these connections allows the signals traversing through these connections to reach their destinations quickly while experiencing no or minimal capacitive load from nearby planar wiring and nearby direct-bonded vertical connections. The planar wiring connections are referred to as x-y wiring or connections, as such wiring stays mostly within a plane define by an x-y axis of the 3D circuit. On the other hand, vertical connections between two dies or between two interconnect layers are referred to as z-axis wiring or connections, as such wiring mostly traverses in the z-axis of the 3D circuit. The use of "vertical" in expressing a z-axis connection should not be confused with horizontal or vertical preferred direction planar wiring that traverse an individual interconnect layer, as further described below.

In some embodiments, the pitch between two neighboring direct-bonded connections 150 can be extremely small, e.g., the pitch for two neighboring connections is between 0.2 µm to 15 µm. This close proximity allows for the large number and high density of such connections between the top interconnect layers 160 and 165 of the first and second dies 105 and 110. Moreover, the close proximity of these connections does not introduce much capacitive load between two neighboring z-axis connections because of their short length and small interconnect pad size. For instance, in some embodiments, the direct bonded connections are less then 1 or 2 µm in length (e.g., 0.1 to 0.5 µm in length), and facilitate short z-axis connections (e.g., 1 to 10 µm in length) between two different locations on the two dies even after accounting for the length of vias on each of the dies. In sum, the direct vertical connections between two dies offer short, fast paths between different locations on these dies.

Stacking IC dies to share power, clock and/or data-bus signals between two dies reduces the overall number of interconnect layers of the two dies because it allows the two dies to share some of the higher-level interconnect layers in order to distribute power, clock and/or data-bus signals. For example, as further described below, this sharing of interconnect layers allows the two dies to share one power mesh between them. In some embodiments, this shared power mesh is formed by direct bonding a power/ground top interconnect layer of one die (e.g., layer 160 of the first die 105) with a power/ground top interconnect layer of the other die (e.g., layer 165 of the second die 110). In other embodiments, this shared power mesh is formed by two interconnect layers of one die (e.g., the top two interconnect layers of the second die 110) that are shared with the other die (e.g., the first die 105). Reducing the higher-level interconnect layers is beneficial as the wiring on these layers often consume more space due to their thicker, wider and coarser arrangements. In addition, the ability to share the use of these interconnect layers on multiple dies may reduce the congestion and route limitations that may be more constrained on one die than another.

Stacking the IC dies in many cases also allows the wiring for delivering the power, clock and/or data-bus signals to be much shorter, as the stacking provides more candidate locations for shorter connections between power, clock and/or data-bus signal interconnects and the circuit components that are to receive these signals. For instance, as further described below, some embodiments provide data-bus signals to circuits on the first data through short direct-bonded connections from a data bus on a shared interconnect layer of the second die. These direct-bonded connections are much shorter than connections that would route data-bus signals on the first die about several functional blocks in order to reach a circuit within another block from that block's periphery. The data signals that traverse the short direct-bonded connections reach their destination circuits on the first die very quickly (e.g., within 1 or 2 clock cycles) as they do not need to be routed from the periphery of the destination block. On a less-congested shared interconnect layer, a data-bus line can be positioned over or near a destination circuit on the first die to ensure that the data-bus signal on this line can be provide to the destination circuit through a short direct-bonded connection.

Figure 2:
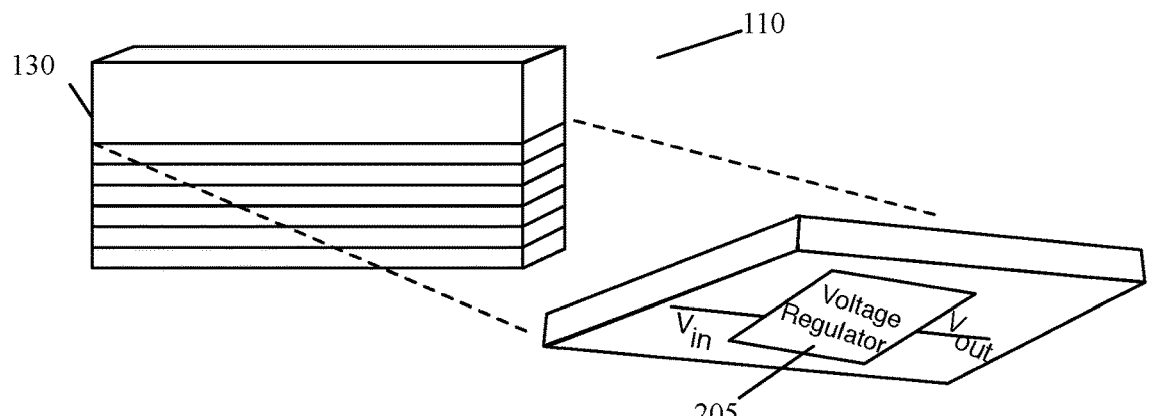
FIGS. 2-4 illustrate examples of a first die in some embodiments using power circuits, clock circuits, and/or data-bus circuits that are formed on a substrate of a second die.
Figure 3:
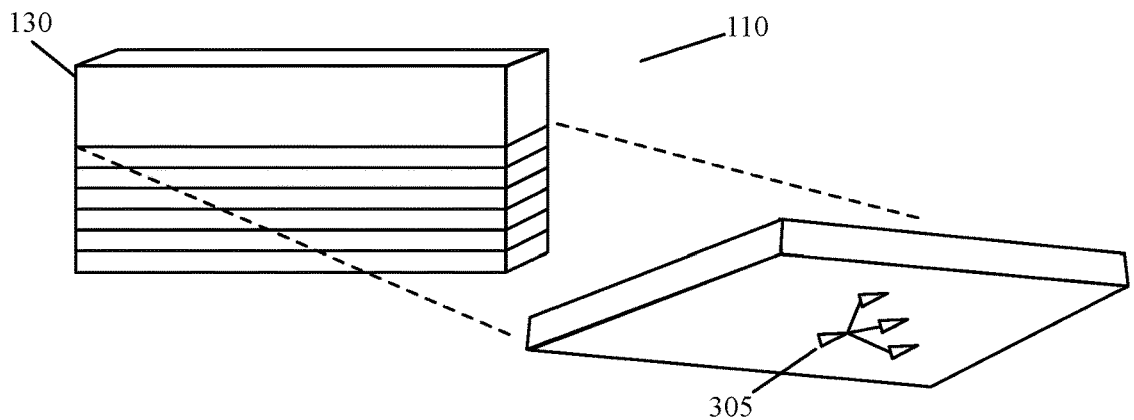
Figure 4:
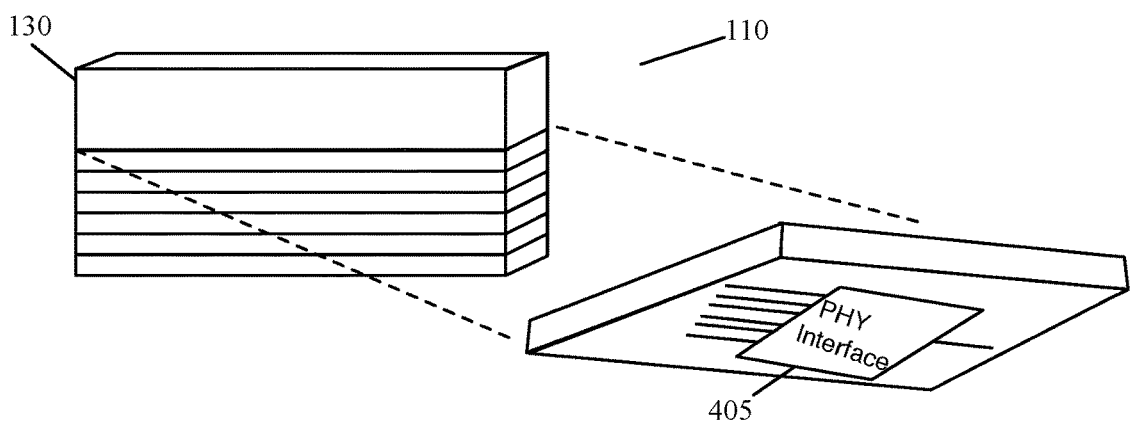

Stacking the IC dies also allows the dies to share power, clock and/or data-bus circuits. For instance, as shown in FIGS. 2-4, the first die 105 in some embodiments uses power circuits, clock circuits, and/or data-bus circuits that are formed on the substrate 130 of the second die 110. In these figures, the examples of power, clock and data-bus circuits are respectively voltage regulators 205, clock drivers 305, and PHY (physical layer) interfaces 405 (e.g., chip I/O interface, memory I/O interface, etc.).

Having the first die share power, clock and/or data-bus circuits defined on the second die frees up space on the first die to implement other circuits and functional blocks of the 3D circuit. The resulting savings can be quite significant because power, clock and/or data-bus circuits can consume a significant portion of available space. For example, chip I/O circuits (e.g., SERDES I/O circuits) and memory I/O circuits (e.g., DDR memory I/O circuits) can be larger than many other circuits on an IC. Pushing off all or some of the power and clock circuits from the first die to the second die further frees up space on the first die because power and clock circuits often need to be isolated from other circuits and/or signals that can affect the operation of the power and clock circuits. Having system level circuits on just one die also allows for better isolation of such circuits (e.g., better isolation of voltage regulators and/or clock circuits).

In sum, stacking the IC dies optimizes the cost and performance of a chip stack system by combining certain functionalities into common interconnect layers and sharing these functions with multiple die in the stack. The functionalities provided by the higher-level interconnect layers can be shared with multiple dies in the stack. The higher-level interconnect layers require thicker and wider metal and coarser pitch. Removing them allows each chip to be connected with a few inner level interconnect layers with higher density vias to enable higher performance and lower cost. Examples of the high-level interconnect layers include system level circuitry layers, and RDL layers. The system circuits include power circuits, clock circuits, data bus circuits, ESD (electro-static discharge) circuits, test circuits, etc.

Each interconnect layer of an IC die typically has a preferred wiring direction (also called routing direction). Also, in some embodiments, the preferred wiring directions of successive interconnect layers of an IC die are orthogonal to each other. For example, the preferred wiring directions of an IC die typically alternate between horizontal and vertical preferred wiring directions, although several wiring architectures have been introduced that employ 45 degree and 60 degree offset between the preferred wiring directions of successive interconnect layers. Alternating the wiring directions between successive interconnect layers of an IC die has several advantages, such as providing better signal routing and avoiding capacitive coupling between long parallel segments on adjacent interconnect layers.

Figure 5:
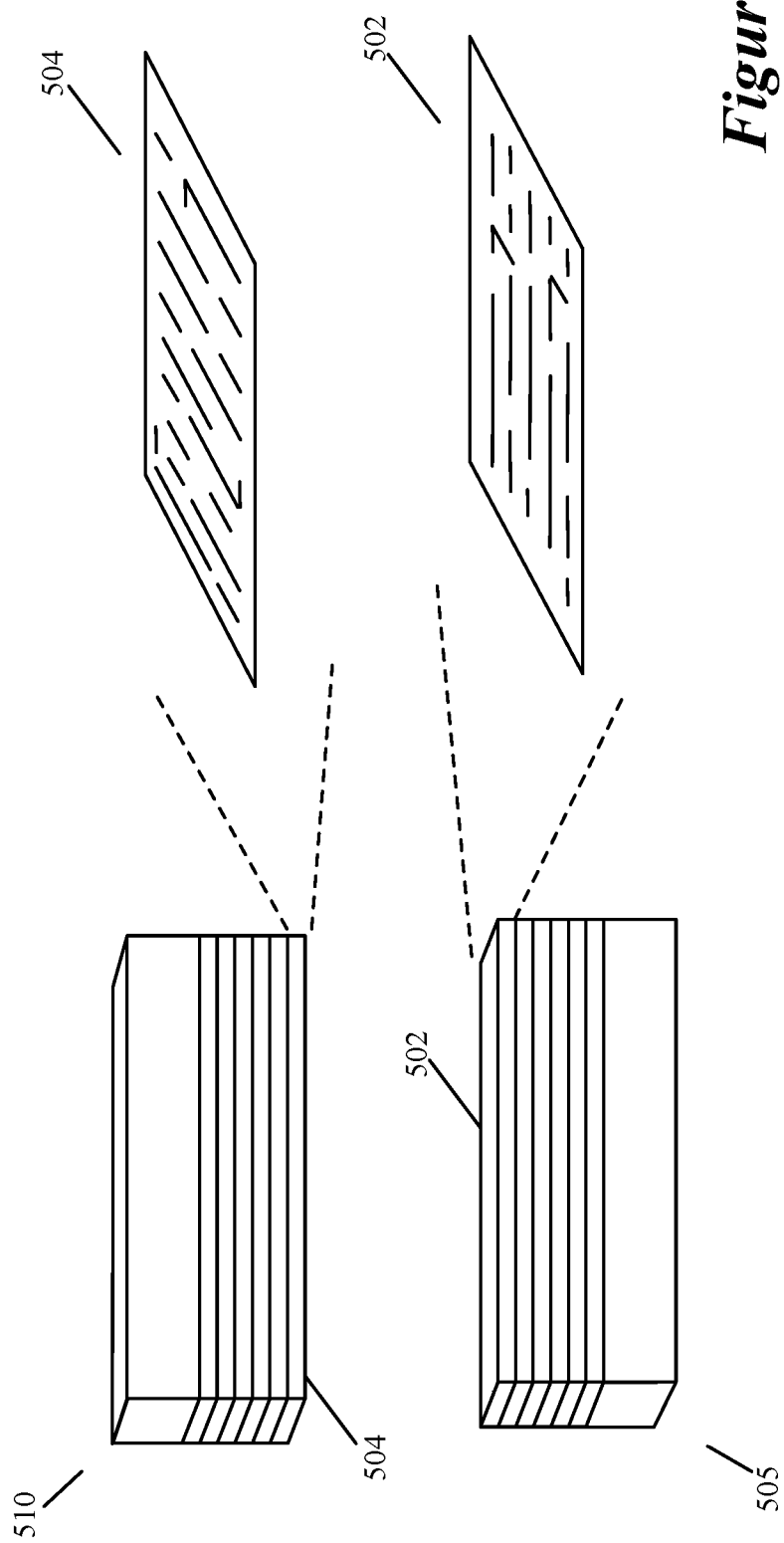
FIG. 5 illustrates an example of the top interconnect layers of the first and second dies having preferred wiring directions that are orthogonal to each other.

When face-to-face mounting of first and second IC dies, some embodiments have the preferred wiring directions of the top interconnect layers of the first and second dies be orthogonal to each other in order to realize these same benefits as well as other unique benefits of orthogonal preferred wiring directions at the juncture of the face-to-face mounting. FIG. 5 illustrates an example of the top interconnect layers of the first and second dies 505 and 510 having preferred wiring directions that are orthogonal to each other. In this example, the top interconnect layer 502 of the first die 505 has a preferred horizontal direction, while the top interconnect layer 504 of the second die 510 has a preferred vertical direction. As shown, the first die's top layer 502 can have short vertical wire segments, and the second die's top layer 504 can have short horizontal wire segments. However, the majority of the segments on the top layers 502 and 504 are respectively horizontal and vertical.

Figure 8:
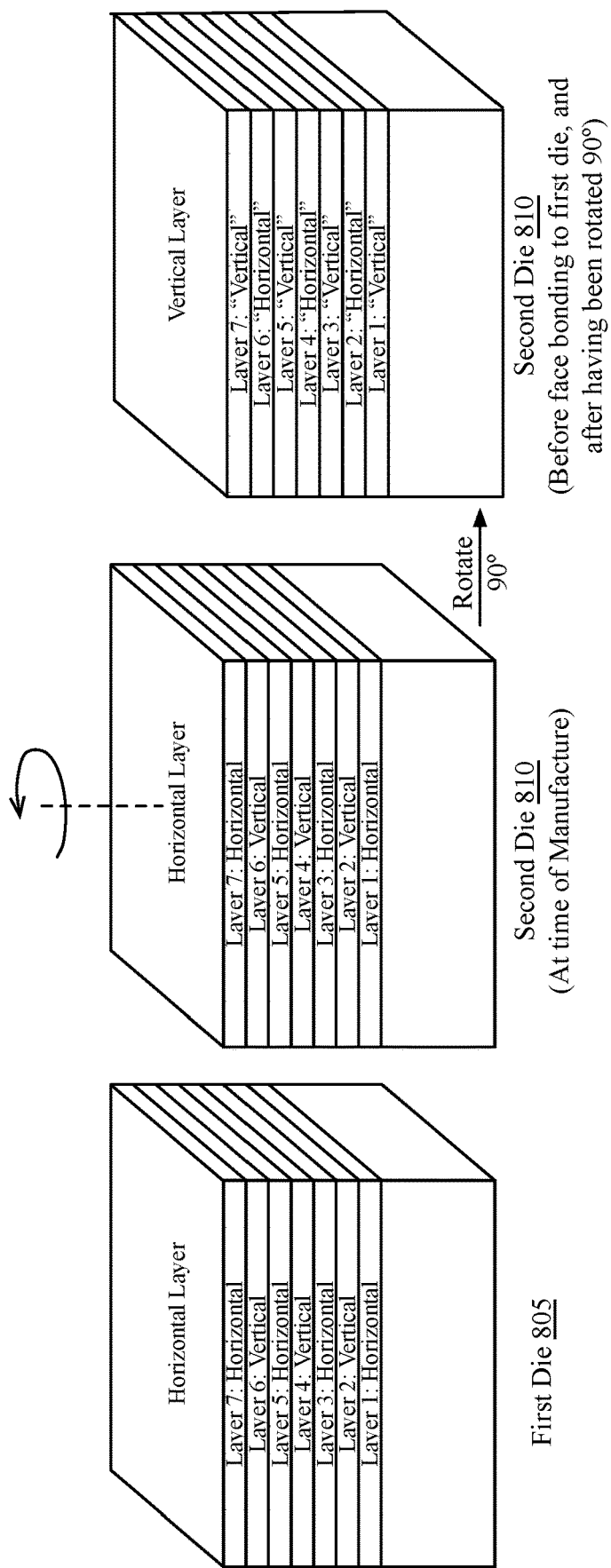

Different embodiments employ different techniques to ensure that the preferred wiring directions of the top interconnect layers of the first and second dies are orthogonal to each other. FIGS. 6-8 illustrate examples of several such techniques. FIG. 6 illustrates that the two dies 605 and 610 are manufactured with different processes in some embodiments. The process for the first die 605 defines the first interconnect layer of the first die to have a horizontal preferred wiring direction, while the process for the second die 610 defines the first interconnect layer of the second dies to have a vertical preferred wiring direction. As both these processes define seven interconnect layers above the IC substrate and alternate the preferred wiring directions between successive layers, the seventh layer of the first die has a horizontal preferred direction while the seventh layer of the second die has a vertical preferred direction.

FIG. 7 illustrates an example in which the first and second dies have different preferred wiring directions for their top interconnect layers because they have different number of interconnect layers. In this example, the preferred wiring direction of the first interconnect layer of both dies 705 and 710 has the same wiring direction (the horizontal in this example). However, the first die has seven interconnect layers while the second die has six interconnect layers. Hence, the top interconnect layer (the seventh layer) of the first die has a horizontal preferred wiring direction, while the top interconnect layer (the sixth layer) of the second die has a vertical preferred wiring direction.

FIG. 8 presents an example that illustrates achieving orthogonal preferred wiring directions between the top interconnect layers of the two face-to-face mounted dies 805 and 810 by rotating one of the two dies by 90 degrees. In this example, the preferred wiring directions of the interconnect layers of the first and second dies 805 and 810 are identical, i.e., they both start with a horizontal preferred wiring direction, alternate the preferred wiring directions for successive layers, and end with a vertical preferred wiring direction.

Also, in some embodiments, the first and second dies 805 and 810 are fabricated with several masks that are jointly defined as these two dies implement one IC design. The jointly defined masks for the two dies 805 and 810 share one or more common masks in some embodiments. In other embodiments, the first and second dies 805 and 810 are from different manufacturing processes and/or different foundries.

However, before face-to-face stacking the two dies 805 and 810, the second die is rotated by 90 degrees. This rotation in effect flips the preferred wiring direction of each interconnect layer of the second die to be orthogonal to the preferred wiring direction of the corresponding interconnect layer of the first die. Thus, the top layer of the rotated second die has effectively a vertical preferred wiring direction compared to the horizontal preferred wiring direction of the top layer of the first die.

In FIG. 8, the effective preferred wiring directions of the second die are specified by placing these directions in quotes to indicate that these directions are not indicative of the manufactured preferred directions but are indicative of the wiring directions compared to the first die's wiring direction and are achieved by rotating the second die with respect to the first die. In some embodiments, the two dies 805 and 810 are produced from the same mono crystalline silicon wafer or are produced from two mono crystalline silicon wafers with the same crystalline direction. In some of these embodiments, the two dies 805 and 810 have orthogonal crystalline directions after they have been face-to-face mounted.

Having the preferred wiring direction of the top interconnect layers of the first and second dies be orthogonal to each other has several advantages. It provides better signal routing between the IC dies and avoids capacitive coupling between long parallel segments on adjacent interconnect layers of the two dies. Also, it allows the first and second dies to share the power lines on their top orthogonal layers, and thereby eliminating one or more of their power layers. Orthogonal wiring directions on the top layers of the first and second dies increases the overlap between the power wiring on these layers. This overlap increases the number of candidate locations for bonding different pairs of power wires on the top interconnect layers of the different dies to provide power signals from one die to another die.

Figure 9:
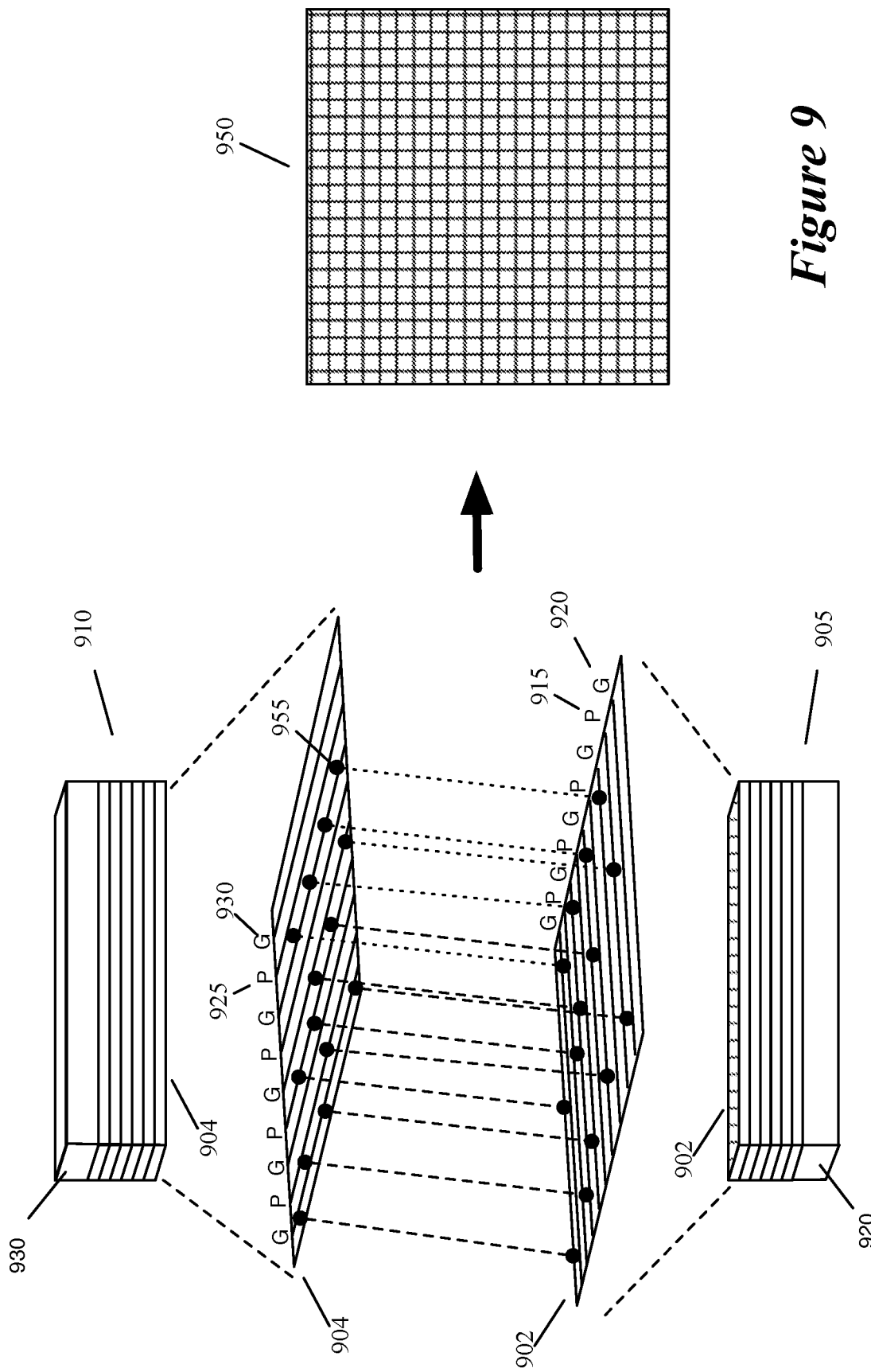
FIG. 9 presents an example that illustrates a power mesh that is formed by the top interconnect layers of two face-to-face mounted dies.

FIG. 9 presents an example that illustrates a power mesh 950 that is formed by the top interconnect layers 902 and 904 of the first and second dies 905 and 910 in some embodiments. This mesh supplies power and ground signals to circuits defined on the first and second substrates 920 and 930 of the first and second dies 905 and 910. As shown, the top interconnect layer 902 of the first die 905 has a set of alternating power lines 915 and ground lines 920 that traverse along the horizontal direction, while the top interconnect layer 904 of the second die 910 has a set of alternating power lines 925 and ground lines 930 that traverse along the vertical direction.

In some embodiments, the power/ground lines on one die's interconnect layer are directly bonded (e.g., through DBI interconnects) to corresponding power/ground lines on the other die's interconnect layer at each or some of the overlaps 955 between corresponding pairs of power lines and pairs of ground lines. This direct bonding creates a very robust power mesh 950 for the first and second dies without using two different interconnect layers for each of these two dies. This frees up at least one interconnect layer on each die and in total eliminates two interconnect layers from the 3D circuit (formed by the face-to-face bonded dies 905 and 910) by having the two dies share one power mesh. Also, the face-to-face mounted top interconnect layers allow thicker and wider interconnect lines to be used for the power signals, which, in turn, allows these signals to face less resistance and suffer less signal degradation.

In some embodiments, the power and ground signals are supplied by power circuitry defined on the substrate of the second die 910 as described above by reference to FIG. 2. In some of these embodiments, the power and ground signals from the power circuitry are supplied from the second die's substrate through vias to the power and ground lines on the top interconnect layer 904 of the second die 910. From this interconnect layer 904, these signals are supplied through direct bonded connections (e.g., DBI connections) to power and ground lines on the top interconnect layer 902 of the first die 905, from where they are supplied to circuits and other interconnect layers of the first die 905.

Figure 10:
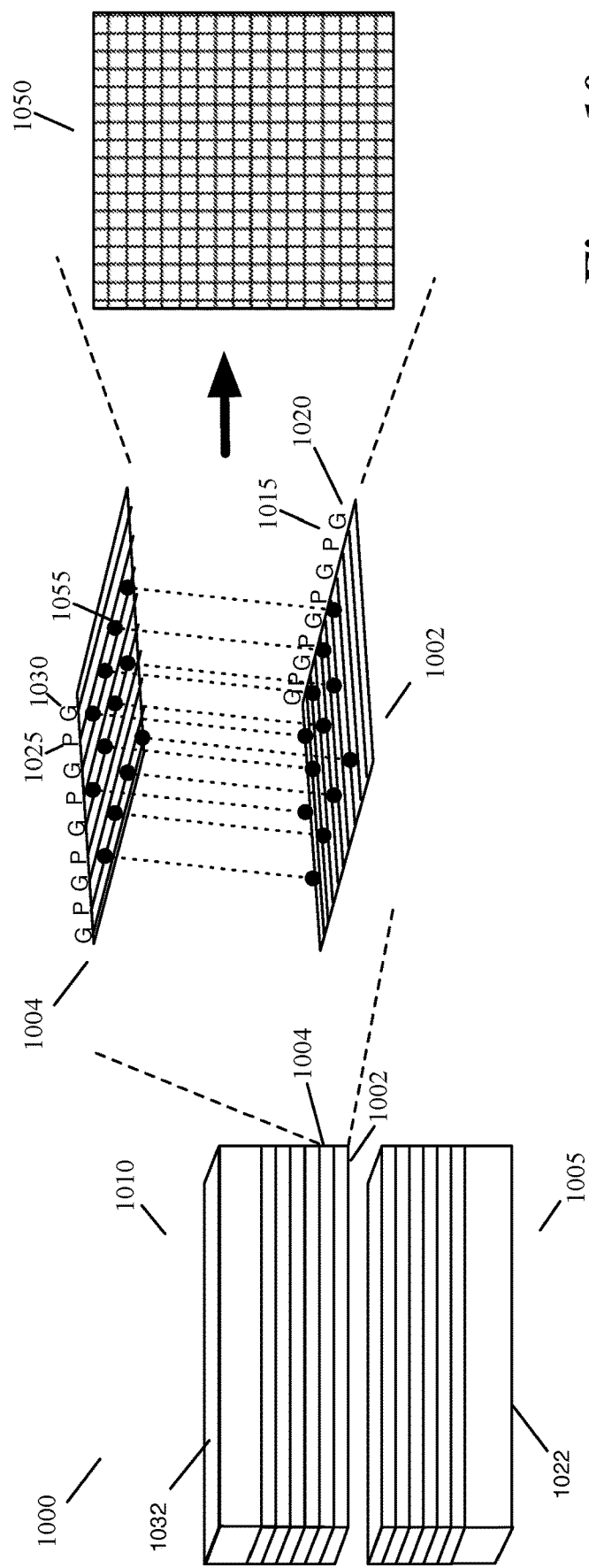
FIG. 10 presents another example for sharing a power mesh between two face-to-face mounted dies.

FIG. 10 presents another example for sharing a power mesh 1050 between the first and second dies 1005 and 1010 in some embodiments. In this example, the power mesh 1050 is formed by the top two interconnect layers 1002 and 1004 of the second die 1010. Other than both of these interconnect layers belonging to the second die 1010, these two interconnect layers 1002 and 1004 are similar to the interconnect layers 902 and 904. Specifically, the interconnect layer 1002 has alternating power lines 1015 and ground lines 1020 while the interconnect layer 1004 has alternating power lines 1025 and ground lines 1030, with vias defined at each or some of the overlaps 1055 between corresponding pairs of power lines and pairs of ground lines.

The power mesh architecture of FIG. 10 consumes two interconnect layers of the second die 1010 but does not use any interconnect layers of the first die. Hence, like the power mesh 950, the power mesh 1050 eliminates in total two interconnect layers from the 3D circuit by having the two dies share one power mesh. Also, defining the power mesh with the top two interconnect layers of the die 1010 allows thicker and wider interconnect lines to be used for the power signals, which, in turn, allows these signals to face less resistance and suffer less signal degradation.

In some embodiments, the power and ground signals are supplied by power circuitry defined on the substrate of the second die 1010 to the power and ground lines 1015-1030 on the top-two interconnect layers 1002 and 1004 of the second die 1010. From these interconnect layers 1002 and 1004, these signals are supplied to power and ground interconnect lines and/or pads on the top interconnect layer of the first die 1005 through direct-bonded connections (e.g., DBI connections) between the first and second dies 1005 and 1010. From the top interconnect layer of the first die 1005, the power and ground signals are then supplied through vias to other interconnect layers of the first die 1005 and to circuits defined on the substrate of the first die.

In power mesh architectures of FIGS. 9 and 10, as well as some of the other figures described below, the direct connections or vias that establish the electrical connections between two power lines on two different layers, or two ground lines on two different layers, electrically shield signals that traverse vertically in between these connections/vias through their own vertical connections or vias that traverse different interconnect layers on the same die or different dies. Also, in these examples, the power lines distribute power and ground signals. One of ordinary skill will realize that in other embodiments, the shared power distribution networks between two or more vertically stacked dies distribute other types of power signals, such as reference voltages ($V_{REF}$) and low power state voltages.

Also, in some embodiments, a first power mesh is defined on the top two interconnect layers of a first die, while a second power mesh is defined on the top two interconnect layers of a second die that is face to face mounted with the first die through a direct bonding process. In some of these embodiments, the direction of the power/ground interconnects on the top interconnect layer of the first die is orthogonal to the direction of the power/ground interconnects on the top interconnect layer of the second die.

In other embodiments, two dies that are face-to-face mounted through a direct bonding process (e.g., a DBI process) have power/ground lines on the top two interconnect layers of a first die (like layers 1002 and 1004 of FIG. 10), but power/ground lines only on the top interconnect layer of the second die. In some of these embodiments, the direction of the power/ground interconnects on the top interconnect layer of the first die is orthogonal to the direction of the power/ground interconnects on the top interconnect layer of the second die. In this face-to-face mounted 3D chip arrangement, one power sub-mesh is formed by the top two interconnect layers of the first die, while another power sub-mesh is formed by the top interconnect layers of the first and second dies. These two sub-meshes form a three-layer shared power mesh on the two dies.

The shared power meshes that are formed by the top interconnect layers of one or both dies are used in some embodiments to shield other types of interconnect lines on these layers or between these layers. Specifically, some embodiments not only share a power mesh between two face-to-face mounted dies, but also share a clock tree that is formed on one or two interconnect layers that are shared between the two dies. In some embodiments, the clock tree is formed on the same shared interconnect layers that form the power mesh, while in other embodiments the interconnect layer or layers that contain the clock mesh are in between the interconnect layers that form the power mesh. The power mesh in some embodiments shields the clock lines from capacitive coupling of the other clock and data interconnect lines.

Figure 11:
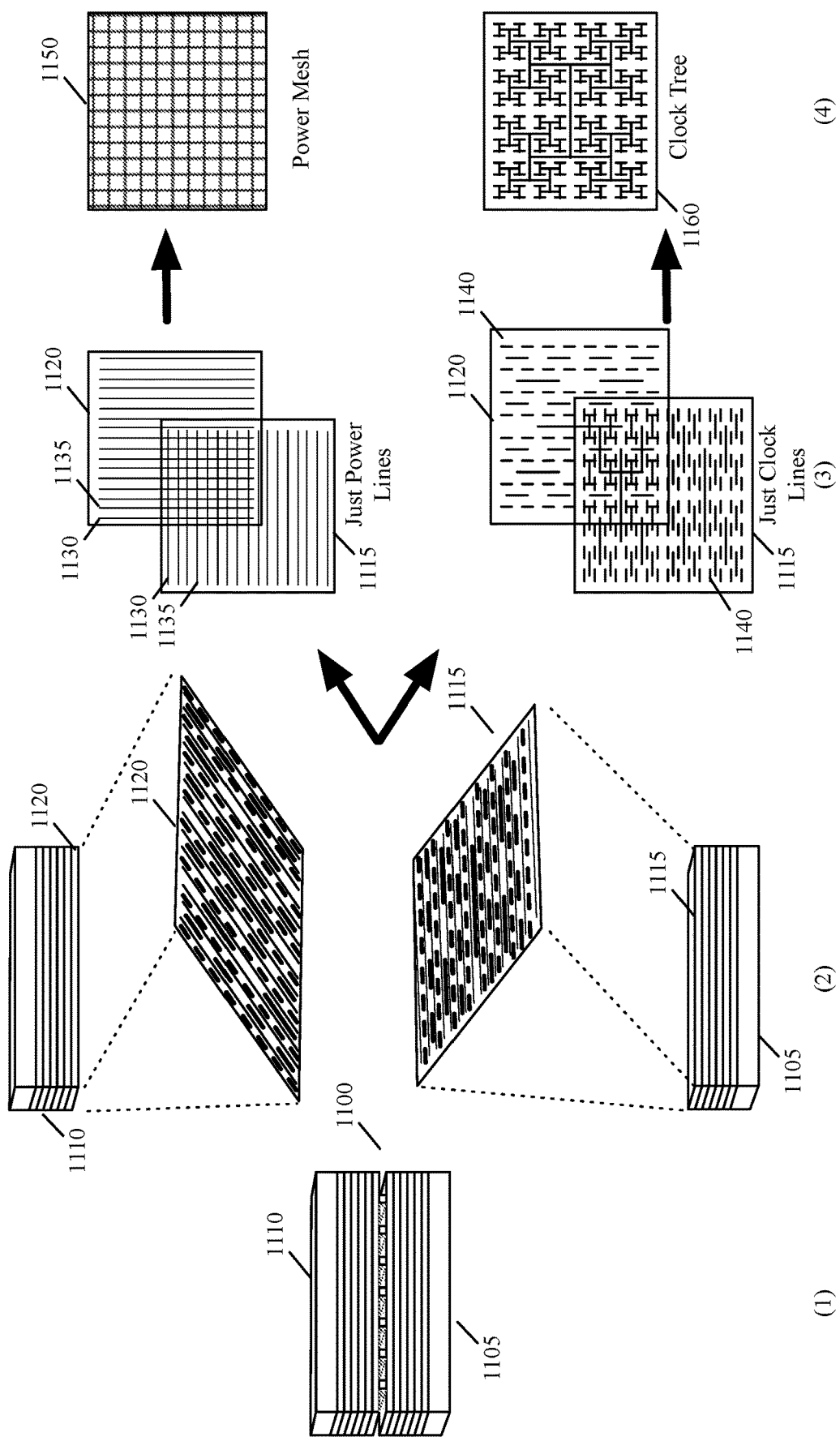
FIG. 11 illustrates a shared interconnect architecture in which the top two interconnect layers of two face-to-face mounted dies have power, ground and clock lines that form a shared power mesh and a shared clock tree.

FIG. 11 illustrates a shared interconnect architecture of some embodiments. In this architecture, the top two interconnect layers 1115 and 1120 of two face-to-face mounted dies 1105 and 1110 (that form a 3D stacked chip 1100) have power, ground and clock lines that form a power mesh 1150 and a clock tree 1160. FIG. 11 has four sets of schematics. The first set shows the two face-to-face mounted dies 1105 and 1110. The second set shows dies 1105 and 1110, and expanded views of the top two interconnect layers 1115 and 1120 of these two dies. The top half of the third set of schematics shows just the power and ground lines on the top two interconnect layers 1115 and 1120, while the bottom half of the third set shows just the clock lines on these two layers. Lastly, top half of the fourth set of schematics shows the power mesh formed by the power and ground lines of the top two interconnect layers 1115 and 1120, while the bottom half of this set shows the clock tree 1160 formed by the clock lines on these two layers.

As shown in the second and third sets of schematics of FIG. 11, the top interconnect layer 1115 of the first die 1105 includes horizontal power lines 1130, ground lines 1135 and clock lines 1140, while the top interconnect layer 1120 of the second die 1110 includes vertical power lines 1130, ground lines 1135 and clock lines 1140. In these schematics, the power/ground lines 1130 and 1135 are thinner, long solid lines, while the clock lines 1140 are thicker, shorter line segments.

The power and ground lines 1130 and 1135 on each interconnect layer alternate in their order (i.e., a power line is followed by a ground line, which is followed by a power line, and so on). Also, one set of clock line segments are placed between each neighboring pair of power and ground lines 1130 and 1135. Thus, each clock line segment 1140 on each interconnect layer is between two power/ground lines 1130 and 1135 that shield the clock line segment from nearby clock and data lines and thereby reduce the capacitive coupling between the clock line segment and the nearby clock and data lines. Also, by virtue of being in the top interconnect layers, the clock line segments are thicker and wider, which, in turn, reduces their resistance and allows the clock signals that they carry to be driven longer distances.

The horizontal and vertical clock line segments on the interconnect layers 1115 and 1120 form a shared H-tree clock structure 1160 that distributes a clock signal to the circuits on the first and second dies 1105 and 1110. The H-tree clock structure will be further described below. To form the clock tree 1160, each horizontal clock line segment on the interconnect layer 1115 is connected through at least one direct bonded connection (e.g., DBI connection) to at least one vertical clock line segment on the interconnect layer 1120. Some of clock line segments on one top interconnect layer (e.g., layer 1115) connect to three clock line segments on the other interconnect layer (e.g., layer 1120) through three direct bonded connections (e.g., DBI connections). Similarly, to form the power mesh 1150, (1) each power line on one interconnect layer (e.g., layer 1115) connects through one or more direct bonded connections (e.g., DBI connections) to one or more power lines on the other interconnect layer (e.g., layer 1120), and (2) each ground line on one interconnect layer (e.g., layer 1115) connects through one or more direct bonded connections (e.g., DBI connections) to one or more ground lines on the other interconnect layer (e.g., layer 1120).

The power mesh 1150 and clock tree 1160 eliminate two or more interconnect layers from the 3D circuit by having the two dies share two interconnect layers 1105 and 1110 that together form the power mesh 1150 and the clock tree 1160. On each die 1105 or 1110, the power, ground and clock signals are distributed among the interconnect layers of that die through vias between the interconnect layers. In some embodiments, power and clock circuits are defined on the substrate of only one of the dies (e.g., on the substrate of the second die 1110). In other embodiments, the power circuits are defined on the substrate of one die (e.g., the substrate of the first die 1105), while the clock circuits are defined on the substrate of the other die (e.g., the substrate of the second die 1110). In other embodiments, power and/or clock circuits are defined on the substrate of both dies 1105 and 1110.

The H-tree clock structure includes a hierarchical series of H-structures, with each H-structure distributing the same clock signal from the center of the H-structure to the outer four corners of the H-structure, where the signal is passed to the center of another, smaller H-structure, until the clock signal reaches the outer corner of the smallest H-structures. The center of the largest H-structure receives the clock signal from a clock circuit that is defined on the second die's substrate in some embodiments. In other embodiments, this signal is supplied to other locations of the H-structure from the clock circuit on the second die's substrate, or to a location on the H-structure from a clock circuit on the first die's substrate. In some embodiments, the clock signal is distributed from H-tree structure 1160 to circuits and interconnects of the first and second dies through vias.

Figure 12:
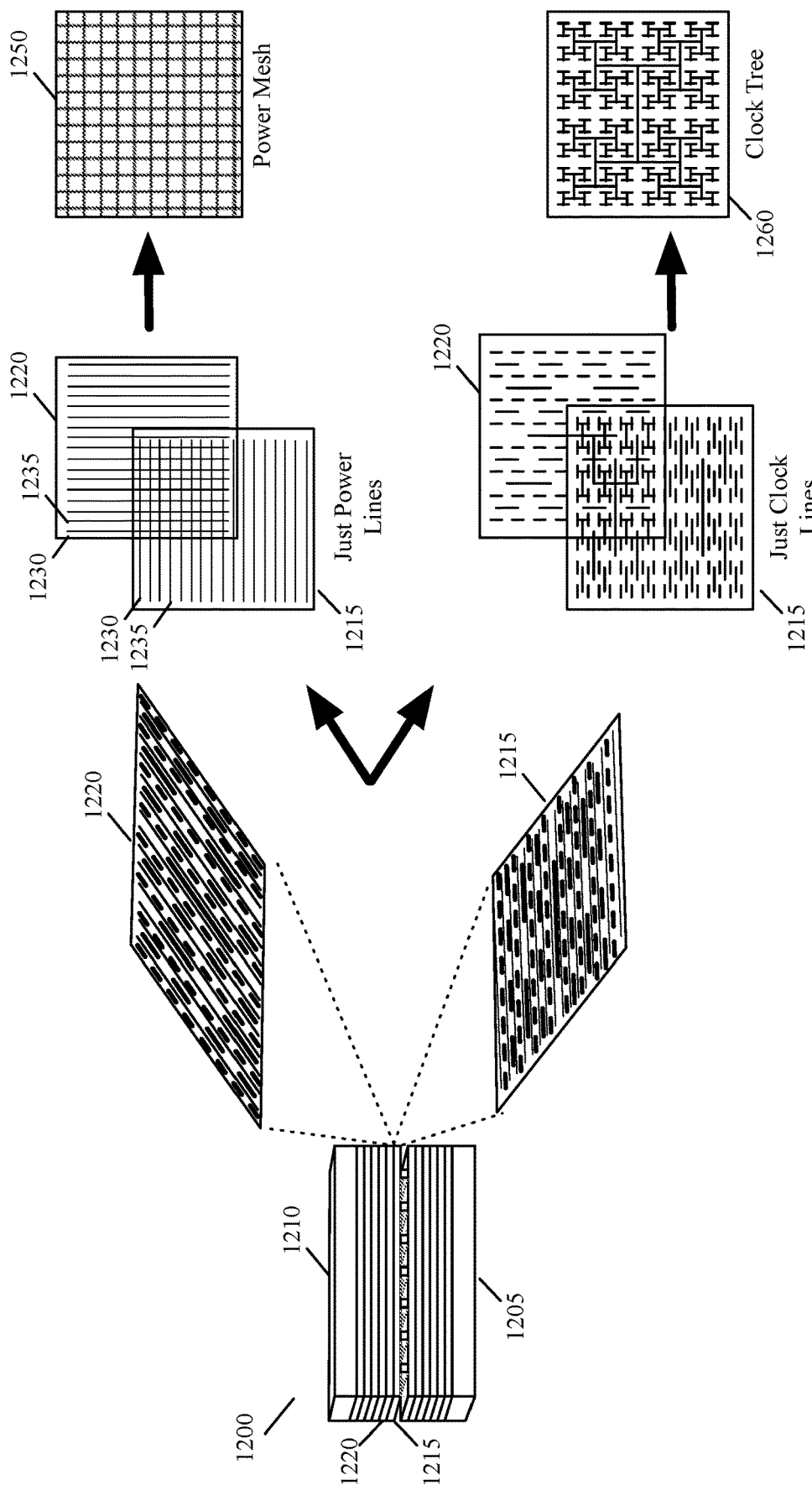
FIGS. 12-15 presents other examples for sharing a power mesh and a clock tree between the two face-to-face mounted dies.

FIG. 12 presents another example for sharing a power mesh 1250 and a clock tree 1260 between the first and second dies 1205 and 1210 in some embodiments. In this example, the power mesh 1250 and the clock tree 1260 are formed by the top two interconnect layers 1215 and 1220 of a second die 1210 that is face-to-face mounted through direct bonded connections with a first die 1205 to form a 3D chip 1200. Other than both of these interconnect layers belonging to the second die 1210, these two interconnect layers 1215 and 1220 are similar to the interconnect layers 1115 and 1120.

Specifically, each interconnect layer 1215 or 1220 has alternating power lines 1225 and ground lines 1230 and clock line segments between neighboring pairs of power and ground lines. Vias are defined at each or some of the overlaps between corresponding pairs of power lines, corresponding pairs of ground lines and corresponding pairs of clock line segments, in order to create the power mesh 1250 and the clock tree 1260. The shared interconnect architecture of FIG. 12 eliminates two or more interconnect layers from the 3D circuit by having the two dies share the two interconnect layers 1215 and 1220 that form the power mesh 1250 and the clock tree 1260.

In some embodiments, the power, ground and clock signals are supplied by power and clock circuitry defined on the substrate of the second die 1210 to the power, ground and clock lines on the interconnect layers 1215 and 1220 of the second die 1210. From these interconnect layers 1215 and 1220, the power, ground and clock signals are supplied to power, ground and clock interconnect lines and/or pads on the top interconnect layer of the first die 1205 through direct-bonded connections (e.g., DBI connections) between the first and second dies 1205 and 1210. From the top interconnect layer of the first die 1205, the power, ground and clock signals are then supplied through vias to other interconnect layers of the first die 1205 and to circuits defined on the substrate of the first die. In some embodiments, power circuits and/or clock circuits are also defined on the substrate of the first die 1205.

Figure 13:
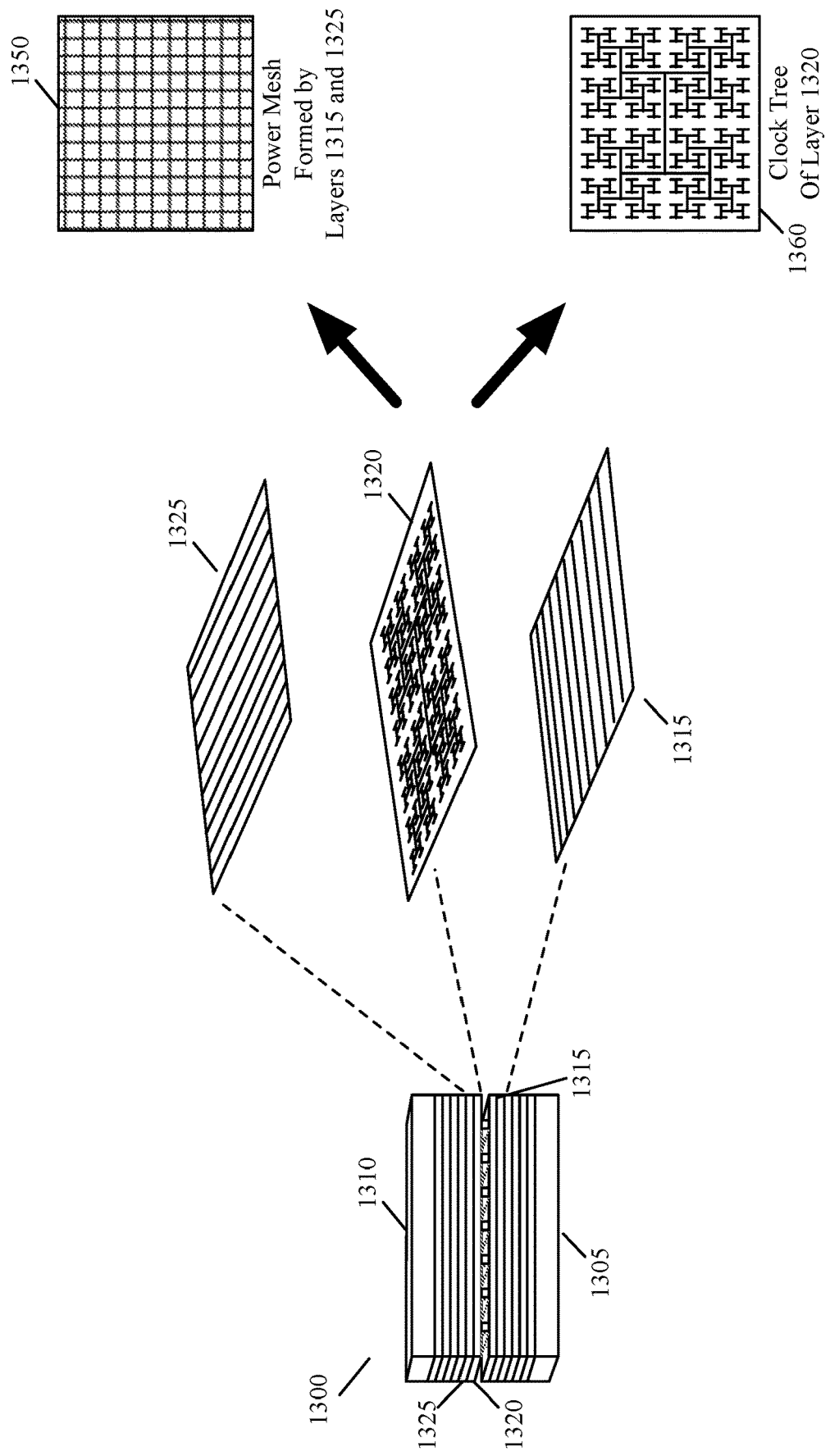

FIG. 13 illustrates another shared interconnect architecture of some embodiments. In this example, a power mesh 1350 and a clock tree 1360 are formed by the top interconnect layer 1315 of a first die 1305 and the top two interconnect layers 1320 and 1325 of a second die 1310, which is face-to-face mounted to the first die 1305 through direct bonded connections to form a 3D chip 1300. The shared architecture of this example is similar to the shared interconnect architecture of FIG. 9, except that the top interconnect layer 1320 of the second die 1310 contains a shared H-tree clock structure 1350 for distributing a clock signal to the circuits on the first and second dies 1305 and 1310, and this interconnect layer 1320 is between two power/ground interconnect layers 1315 and 1325 of the first and second dies 1305 and 1310. This placement of the H-tree clock structure between the power/ground interconnect layers 1315 and 1325 shields the clock line segments in this structure from capacitively coupling to interconnect lines that carry data and other signals on other interconnect layers of the first and second dies 1305 and 1310.

The power/ground lines in some embodiments alternate on each of the interconnect layers 1315 and 1325. Also, in some embodiments, the power/ground lines on the interconnect layer 1325 of the second die connect to pads on this die's interconnect layer 1320, and these pads are connected through direct bonded connections (e.g., DBI connections) to power lines on the interconnect layer 1315. The power/ground signals in some embodiments are distributed to other interconnect and substrate layers on each die through vias.

Also, in some embodiments, the clock signal is distributed from H-tree structure 1360 to circuits and interconnects of the second die through vias, while it is distributed from this structure 1360 to circuits and interconnects of the first die through direct-bonded connections between this structure and clock pads on layer 1315 of the first die. The direct-bonded connections in some embodiments emanate from the corners of some of the H-structures and travel along the z-axis. The center of the largest H-structure in this clock tree receives the clock signal from a clock circuit that is defined on the second die's substrate in some embodiments. In other embodiments, this signal is supplied to other locations of the H-structure from the clock circuit on the second die's substrate, or to a location on the H-structure from a clock circuit on the first die's substrate.

Figure 14:
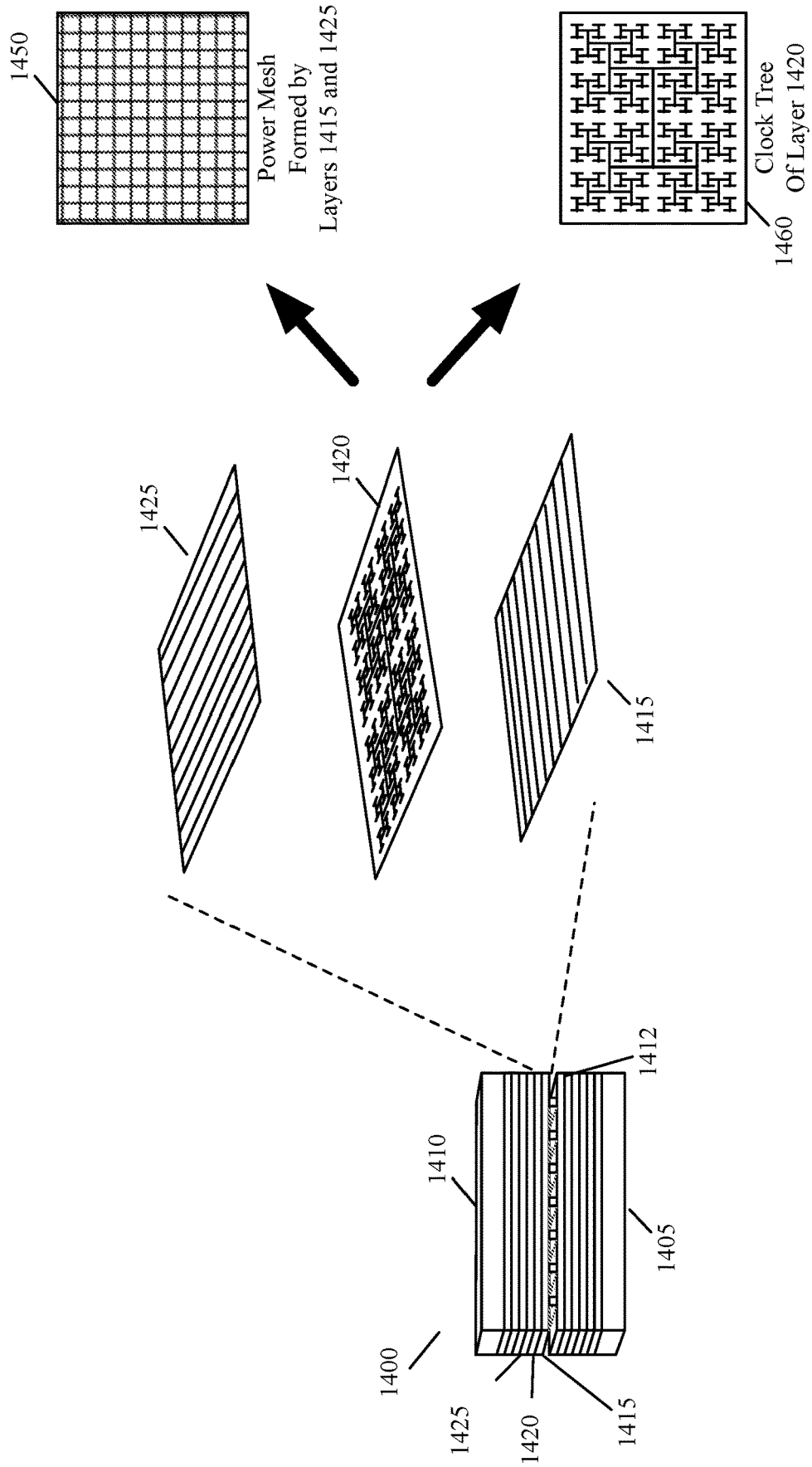

FIG. 14 illustrates yet another shared power/clock interconnect architecture of some embodiments. This architecture 1400 is similar to the power/clock interconnect architecture 1300 of FIG. 13, except that the power and clock interconnect layers 1415, 1420 and 1425 are all interconnect layers of the second die 1410. In this example, the first die 1405 does not contain any interconnect layer that is dedicated to either the power or clock lines. Also, in this example, the H-tree clock structure 1460 is again between the power/ground interconnect layers 1415 and 1425 of the second die 1410, and hence its clock line segments are shielded by these power/ground interconnect layers from capacitive couplings to other interconnect lines that carry data and other signals on other interconnect layers of the first and second dies 1405 and 1410.

In the architecture 1400, the power, ground and clock signals are supplied to circuits and interconnects of the first die by directly bonding these circuits and interconnects through direct-bonded connections from the power/ground lines and clock lines/pads on layer 1415 of the second die to lines/pads on the top layer 1412 of the first die 1405. The power, ground and clock signals are supplied in some embodiments to circuits, interconnects, and pads of the second die through vias. Similarly, in some embodiments, the power, ground and clock signals are supplied from the top layer 1412 of the first die 1405 to circuits and interconnects of the first die 1405 through vias.

Figure 15:
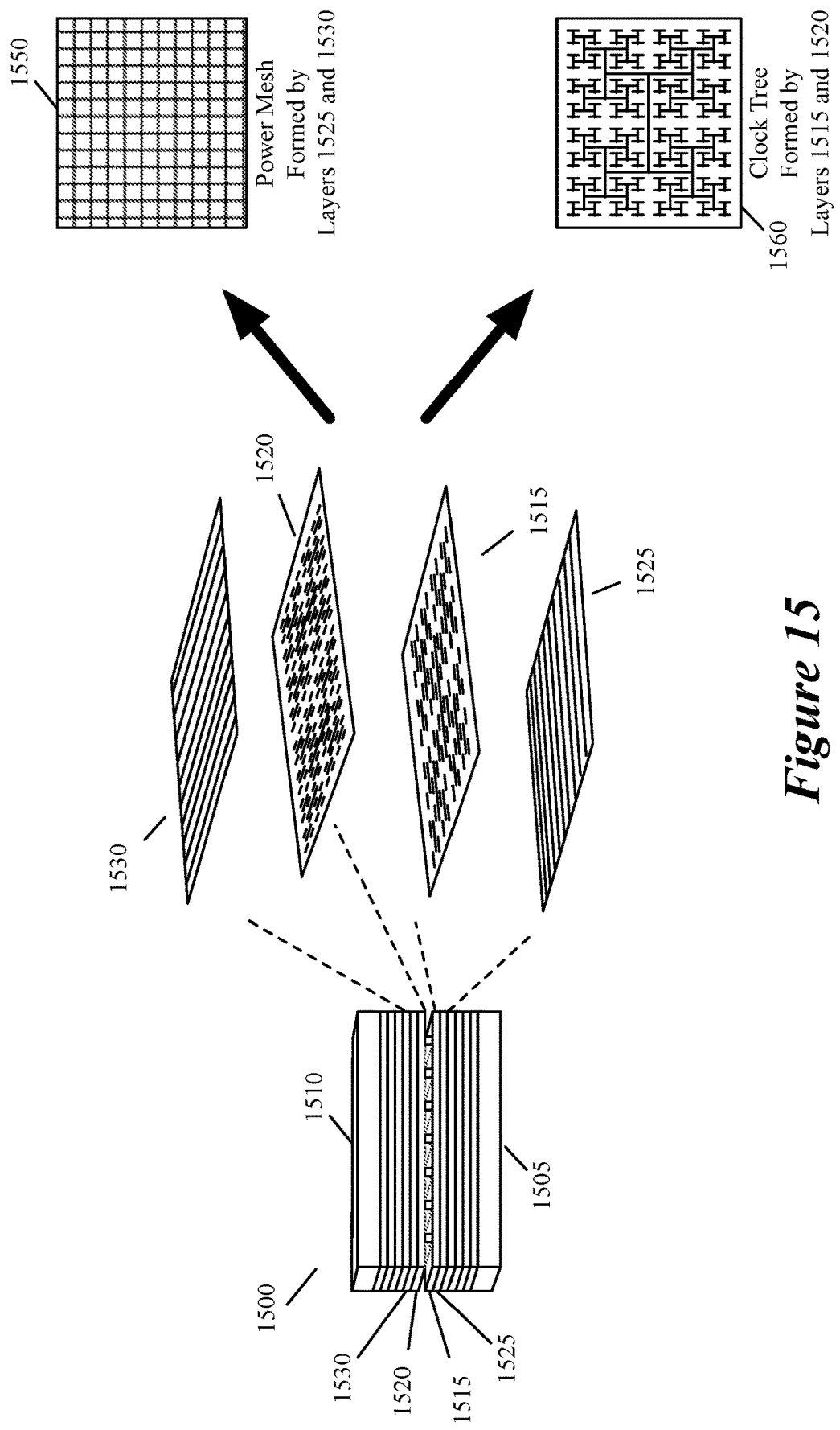

FIG. 15 illustrates yet another shared power/clock interconnect architecture of some embodiments. This architecture 1500 is similar to the power/clock interconnect architecture 1300 of FIG. 13. However, in the architecture 1500, the H-tree structure 1560 is implemented by the top interconnect layers 1515 and 1520 of two dies 1505 and 1510, which are face-to-face mounted through direct bonded connections (e.g., DBI connections) to form a 3D chip 1500. The clock interconnect layer 1515 is the top interconnect layer of the first IC die 1505 and has the horizontal segments of the H-tree structure 1560. The clock interconnect layer 1510 is the top interconnect layer of the second IC die 1510, and has the vertical segments of the H-tree structure 1560.

The vertical and horizontal segments of the H-tree structure 1560 are connected to each other through direct-bonded connections (e.g. DBI connections). The center of the largest H-structure receives the clock signal from a clock circuit that is defined on the second die's substrate in some embodiments. In other embodiments, this signal is supplied to other locations of the H-structure from the clock circuit on the second die's substrate, or to a location on the H-structure from a clock circuit on the first die's substrate. In some embodiments, the clock signal is distributed from the clock lines of the interconnect layer 1515 of the first die 1505 to circuits and interconnects of the first die through vias defined in the first die. Similarly, the clock signal is distributed from the clock lines on the interconnect layer 1520 of the second die 1510 to circuits and interconnects of the second die through vias.

As shown, the H-tree clock structure 1560 is between the interconnect layer 1525 of the first die 1505 and the top interconnect layer 1530 of the second die 1510. Like the position of the H-tree structure 1360, the placement of the H-tree clock structure 1560 between the power/ground interconnect layers 1525 and 1530 shields the clock line segments in this structure from capacitively coupling to interconnect lines that carry data and other signals on other interconnect layers of the first and second dies 1505 and 1510.

In this example, the power/ground layers 1525 and 1530 connect to power/ground pads on clock interconnect layers 1515 and 1520 through vias. The power/ground pads on one of these interconnect layers (e.g., layer 1515) connect to corresponding power/ground pads on the other interconnect layer (e.g., layer 1520) through direct-bonded connections (e.g., DBI connections). Through these vias and direct-bonded connections, corresponding pairs of power/ground lines are connected on the interconnect layers 1525 and 1530 to form the power mesh 1550.

The power/ground signals in some embodiments are distributed to other interconnect and substrate layers on each die through vias. In some embodiments, the four power/clock interconnect layers 1515, 1520, 1525 and 1530 are the interconnect layers of one of the dies (e.g., the second die 1510), and these four layers are shared by the first die 1505. In other embodiments, three of these interconnect layers belong to one die and one of them belongs to another die.

In some embodiments, the 3D chip structure that is formed by two face-to-face mounted dies has one or more clock interconnect layers in between a full power mesh that is formed on the first die and a full/half power mesh that is formed on the second die. A full power mesh on a die in some embodiments includes at least two interconnect layers that contain power/ground interconnect lines. In some of these embodiments, a partial power mesh on a die includes one interconnect layer that contains power/ground interconnect lines, and that connects through z-axis vertical connections (e.g., via and DBI connections) to the power mesh of the other die. In some of these embodiments, the full or partial power mesh layer(s) on one die do not include the top interconnect layer of that die as the top layer is used to carry clock or data interconnect lines (like the top interconnect layers 1515 and 1520 of FIG. 15, which carry clock lines).

Figure 18:
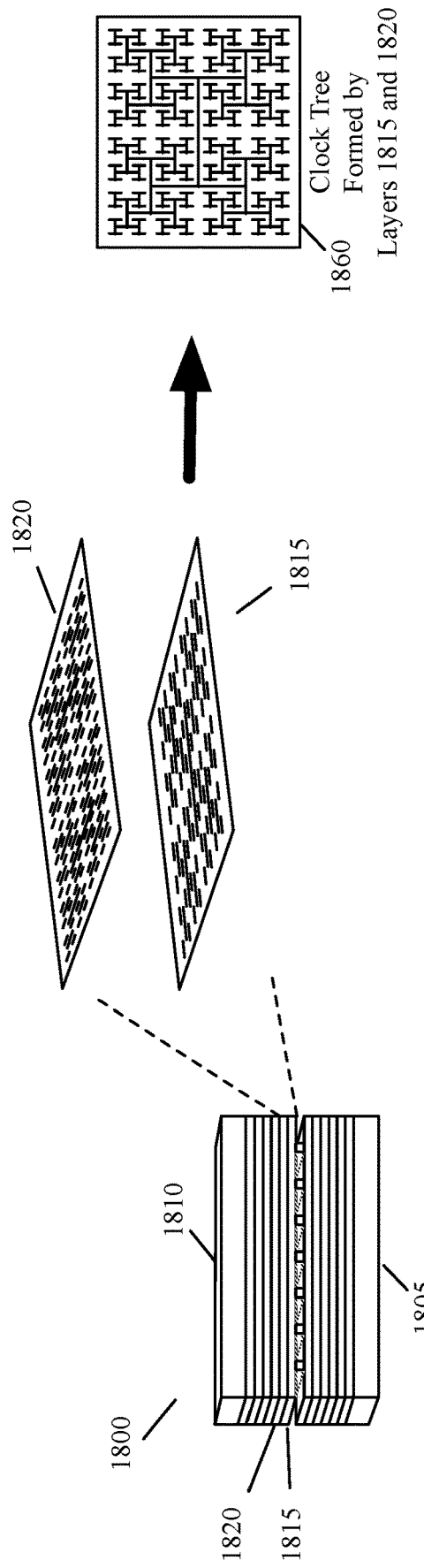

In some embodiments, two vertically stacked IC dies do not share power-distributing interconnect layers but share interconnect layers for sharing clock signal or signals. FIGS. 16-18 illustrate examples of two such shared interconnect architectures. In FIG. 16, two dies 1605 and 1610 are face-to-face mounted through direct bonded connections to form a 3D chip 1600. The top interconnect layer 1620 of the die 1610 includes a clock tree 1660 that is used (1) to distribute a clock signal to other interconnect layers of the die 1610 through vias of this die, and (2) to distribute the clock signal to other interconnect layers of the die 1605 through direct-bonded connections (e.g., DBI connections) to the top interconnect layer 1615 of the die 1605 and then through vias of this die 1605.

As in the examples illustrated in FIGS. 13 and 14, the clock tree 1660 is an H-tree structure. One of ordinary skill will realize that other embodiments use other types of clock distribution structures. The center of the largest H-structure receives the clock signal from a clock circuit that is defined on the second die's substrate in some embodiments. In some of these embodiments, the first IC die 1605 does not include a clock circuit that generates a clock signal. In other embodiments, this signal is supplied to other locations of the H-structure from the clock circuit on the second die's substrate, or to a location on the H-structure from a clock circuit on the first die's substrate.

FIG. 17 illustrates two dies 1705 and 1710 are face-to-face mounted through direct bonded connections to form a 3D chip 1700. In this example, the top interconnect layers 1715 and 1720 of these two dies 1705 and 1710 respectively include horizontal clock line segments 1735 and vertical clock line segments 1740 that together form a clock tree 1760 that is used to distribute a clock signal to other interconnect layers of the dies 1705 and 1710. The horizontal and vertical line segments on the top interconnect layers 1715 and 1720 are connected through direct-bonded connections (e.g., DBI connections) in order to form the H-tree clock structure 1760.

One or more clock line segments on the top layer 1720 of the second die 1710 in some embodiments receive the clock signal from a clock circuit that is defined on the second die's substrate. In some embodiments, the clock signal is distributed from the clock lines on the interconnect layer 1715 of the first die 1705 to circuits and interconnects of the first die through vias of the first die. Similarly, the clock signal is distributed from the clock lines on the interconnect layer 1720 of the second die 1710 to circuits and interconnects of the second die through vias.

FIG. 18 illustrate yet another shared interconnect structure for distributing clock signals between two face-to-face mounted IC dies. This architecture is similar to the architecture of FIG. 17, except that in FIG. 18 the horizontal and vertical clock interconnect layers 1815 and 1820 both belong to a second die 1810 that is face-to-face mounted through direct bonded connections to a first die 1805 to form a 3D chip 1800. In this architecture, vias between the interconnect layers 1815 and 1820 of the second die establish the connections between the clock lines on these layers in order to create the clock structure 1860 (i.e., the H-tree structure 1860) in this example.

Direct bonded connections between the first and second dies 1805 and 1810 then supply the clock signal from this clock structure to clock lines/pads on the top interconnect layer of the first die 1805. The clock signal is then passed to other interconnect and substrate layers of the first die 1805 through vias. The clock signal is also passed to other interconnect and substrate layers of the second die 1810 through vias. In some embodiments, a clock circuit on the second die's substrate supplies the clock signal to one or more clock line segments on interconnect layer 1815 and/or interconnect layer 1820 of the second die 1810. In other embodiments, the clock signal is generated by a clock circuit defined on the substrate of the first die 1805.

One of the unique features of the 3D chips illustrated in FIGS. 11-18 is that in these chips, the clock lines are moved to the top interconnect layers of a die, or next to the top interconnect layer of the die. Typically, clock lines are not in the top interconnect layers as such a placement would expose the clock signals/lines to interfering signals outside of the chip. However, the face-to-face mounted dies of FIGS. 11-18 can place the clock lines in their top interconnect layers as these layers are very well isolated from signals outside of their 3D chips because these interconnect layers are effectively in the middle of the die stack.

In addition to isolating the clock signals, the face-to-face mounted top interconnect layers allow thicker and wider interconnect lines to be used for the clock signals. These signals have less resistance and suffer less signal degradation. Hence, the clock signals can be driven longer distance with no clock signal regeneration (which would require the clock signals to travel to the buffer circuits formed on a semiconductor substrate) or with less clock signal regeneration. This lower resistance advantage (i.e., less signal degradation advantage) of thicker and wider interconnects on upper interconnect layers is also enjoyed by power and data interconnect line segments that are defined on the upper interconnect layers and that are shared between two or more vertically stacked IC dies (e.g., two face-to-face mounted IC dies).

Figure 19:
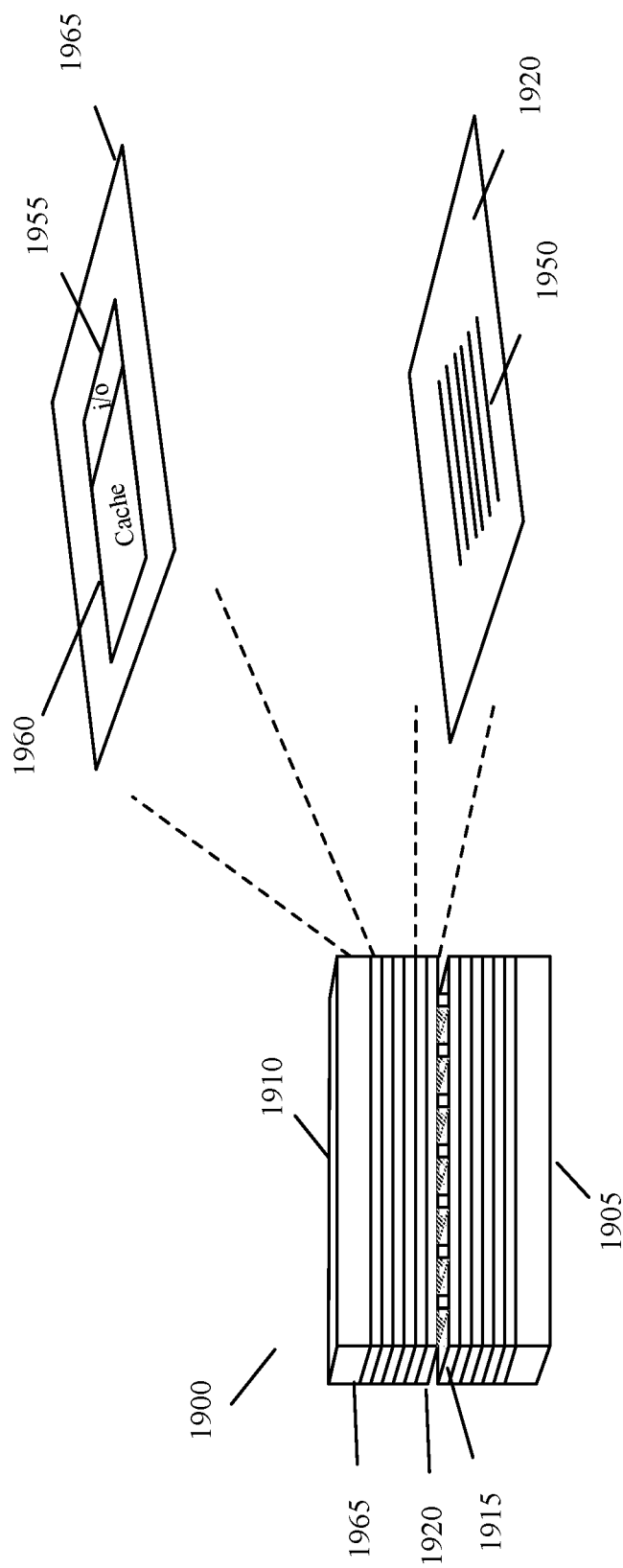
FIGS. 19 and 20A presents examples for sharing a data bus between the two face-to-face mounted dies.

As mentioned above, stacking IC dies also allows two or more dies to share a data bus on one or more share interconnect layers. FIG. 19 illustrates an example of one such shared interconnect layer architecture that allows two face-to-face mounted IC dies to share a data bus and a data storage that are defined on one of the dies. In this example, the data storage is an on-chip cache 1960. In other embodiments, the shared data storage is any other type of storage. In FIG. 19, the two face-to-face mounted IC dies 1905 and 1910 (that form a 3D chip 1900) share a data bus 1950 that is defined on a top interconnect layer 1920 of the second die 1910. As shown, this top interconnect layer 1920 connects to the top interconnect layer 1915 of the first die 1905 through direct bonded connections (e.g., DBI connections).

Although a data bus does not necessarily need to include parallel interconnect lines, the data bus 1950 in this example includes several parallel interconnect lines that connect to other interconnect lines on the first and second dies through vias and direct-bonded connections at one or more locations along each interconnect line. These lines are shown to be physically parallel, but in other cases, they are just topologically parallel (e.g., on one end, they connect to several adjacent locations at one position of a die or interconnect layer, while on another end, they connect to several other adjacent locations at another position in a die or interconnect layer). The data bus 1950 connects through interconnect lines and vias to an input/output interface 1955 of a cache storage 1960 that is defined on the substrate 1965 of the second die 1910. Through interconnect lines and vias, the data bus 1950 also connects to circuits defined on the second die 1910, so that through these connections and the I/O interface 1955 these circuits can receive output data read from the cache storage 1960, and provide input data for storing in the cache storage 1960.

Through the direct bonded connections, the data bus 1950 also connects to interconnect lines/pads on the top interconnect layer 1915 of the first die 1905. These interconnect lines/pads on the interconnect layer 1915 connect to circuits on the first die 1905 through interconnect lines and vias of the first die 1905. Through these connections (i.e., the interconnect lines, vias and direct-bonded connections) and the I/O interface 1955, the circuits defined on the first die 1905 can receive output data read from the cache storage 1960, and provide input data for storing in the cache storage 1960.

Stacking the IC dies so that they can share one or more data buses allows the wiring for delivering the data to be much shorter, as the stacking provides more candidate locations for shorter connections between data bus interconnects and the circuit components that are to receive these signals. For instance, instead of routing data signals on the second die about several functional blocks in order to reach a circuit or component within another block from that block's periphery, the data signals can be provided directly to that circuit or component on the second die from data-bus interconnect on the shared interconnect layer of the first die. The data signal can be provided to its destination very quickly (e.g., within 1 or 2 clock cycles) as it does not need to be routed from the destination block's periphery, but rather is provided by a short interconnect from the shared interconnect layer above. Shorter connections for data signals reduce the capacitive load on the connections that carry these signals, which, in turn, reduces the signal skew on these lines and allows the 3D circuit to use no or less signal isolation schemes.

Figure 20A:
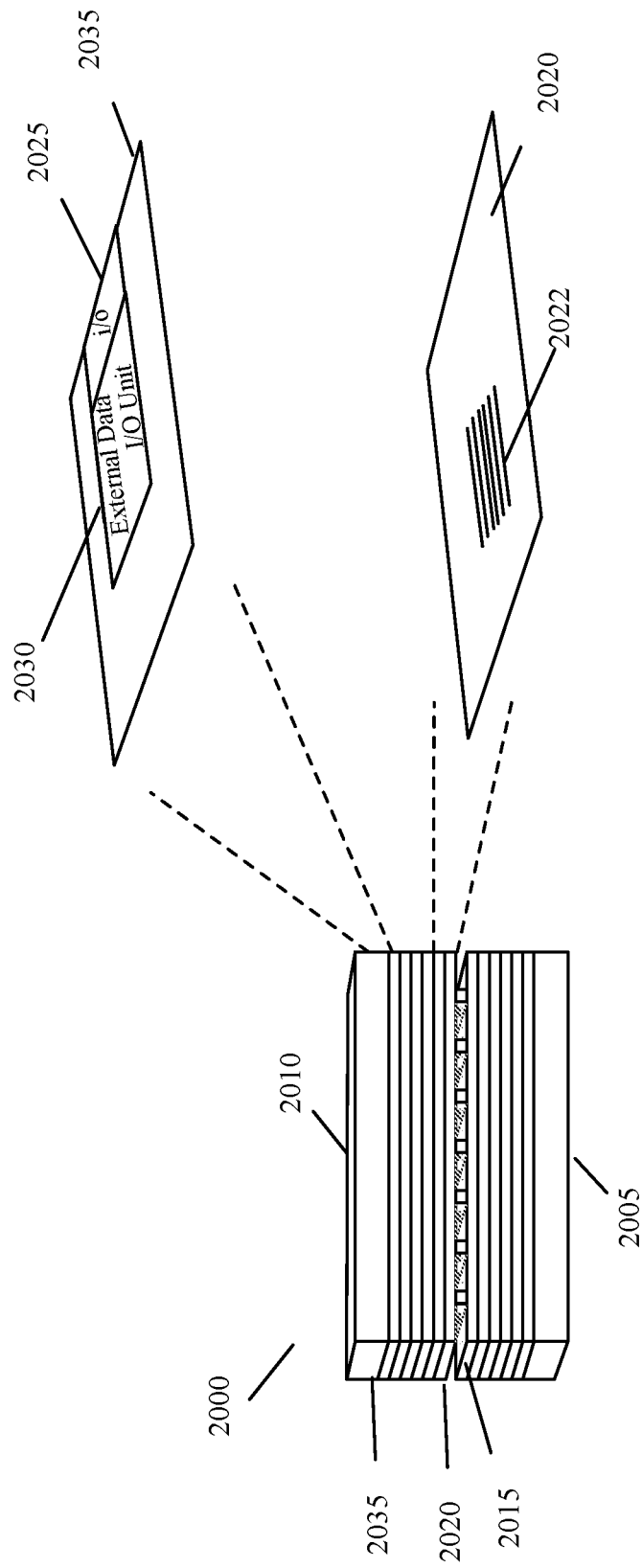

FIG. 20A illustrates another example of two face-to-face mounted IC dies sharing resources. In this example, the circuits of first and second dies 2005 and 2010 of the two dies share data I/O circuitry, which includes an I/O interface 2025, an external data I/O unit 2030 (e.g., level shifting drivers), and a data I/O bus 2022 formed by a number of data bus lines. The data I/O unit 2030 can be an external memory I/O unit or another data interface unit, such as a SerDes unit. In FIG. 20A, the two face-to-face mounted IC dies 2005 and 2010 form a 3D chip 2000. Through silicon vias (TSVs) are defined on the backside of the second die 2010. Through these TSVs and the I/O interface, data is received and supplied to the data I/O unit 2030 defined on the substrate of the second die 2010.

The data I/O unit 2030 connects through interconnect lines and vias of the second die to the data bus 2022 that is defined on a top interconnect layer 2020 of the second die 2010. As shown, this top interconnect layer 2020 connects to the top interconnect layer 2015 of the first die 2005 through direct bonded connections (e.g., DBI connections). In this example, the data bus 2022 is again shown to have several parallel interconnect lines that connect to other interconnect lines on the first and second dies through vias and direct-bonded connections at one or more locations along each interconnect line. However, as mentioned above, the interconnect lines of a data bus do not necessarily need to be parallel.

Through interconnect lines and vias, the data bus 2022 connects to circuits defined on the second die 2010, so that through these connections these circuits can receive data from and supply data to the data I/O unit 2030. Through the direct bonded connections, the data bus 2022 also connects to interconnect lines/pads on the top interconnect layer 2015 of the first die 2005. These interconnect lines/pads on the interconnect layer 2015 connect to circuits on the first die 2005 through interconnect lines and vias of the first die 2005. Through these connections (i.e., the interconnect lines, vias and direct-bonded connections), the circuits defined on the first die 2005 can receive data from and supply data to the data I/O unit 2030.

Some embodiments distribute an IO circuit between two or more vertically stacked IC dies. For instance, some embodiments distribute a SerDes circuit between two vertically stacked IC dies. A SerDes circuit includes digital (logic) portions and analog portions. In some embodiments, the digital portions of the SerDes circuit are implemented on a first IC die, while the analog portions are implemented on a second IC die that is face-to-face mounted or otherwise vertically stacked with the first die. This IO interface has to involve the interaction between these two layers before signals are passed to the core circuitry. Only the two layers together complete the IO circuitry.

Figure 20B:
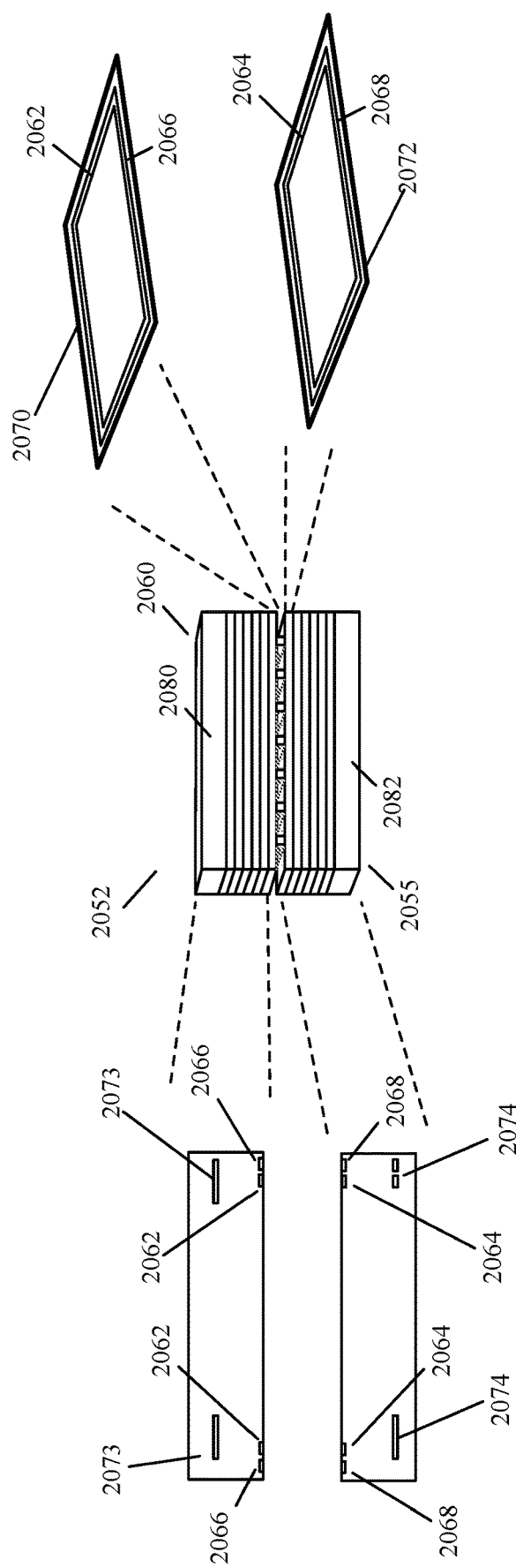
FIG. 20B illustrates another example of two face-to-face mounted IC dies that form a 3D chip and that share data I/O circuits.

FIG. 20B illustrates another example of two face-to-face mounted IC dies that form a 3D chip 2052 and that share data I/O circuits. In this example, the I/O circuitry is defined on both dies 2055 and 2060 in order to reduce the area that the I/O circuitry consumes on each die. The I/O circuitry in this example includes two sets of power and ground rails 2062-2068, ESD (electro-static discharge) circuits 2073, drivers 2074, and decoupling capacitors (not shown).

The power/ground rails include two power rails 2062 and 2066 on the top interconnect layer 2070 of the second die 2060 and two ground rails 2064 and 2068 on the top interconnect layer 2072 of the first die 2055. The power and ground rails 2062 and 2064 are the I/O interface power and ground rails that carry the power and ground signals for the I/O circuitry (e.g., I/O drivers). The power and ground rails 2066 and 2068 are the core power and ground rails that carry the power and ground signals for the core circuits of the first and second dies. The core circuits of the dies are the circuits that perform the computation operations of the dies.

In some embodiments, each power or ground rail is a rectangular ring formed by four rectangular segments, with each segment spanning one of the four sides of the die and connecting to two other rectangular segments of the same rail. In other embodiments, each power rail is not a contiguous ring that spans the entire periphery of the die, as it has one or more discontinuities (e.g., at the corners of the interconnect layer on which it resides). Also, while showing power and ground rails on the top interconnect layers 2070 and 2072, one of ordinary skill will realize that in some embodiments power and ground rails exist on other interconnect layers of the dies (e.g., power rails on several interconnect layers of one die, and ground rails on several interconnect layers of the other die).

Multiple drivers 2074 are formed on the substrate 2082 of the first die 2055. When signals traverse from circuits outside of the dies to core circuits of the die, the drivers 2074 level shift these signals to convert them from their external voltage levels to internal voltage levels. Similarly, when signals traverse from the core circuits of the die to circuits outside of the dies, the drivers 2074 level shift these signals to convert them from their internal voltage levels to external voltage levels. The drivers 2074 also provide signal buffering. To perform their operations (e.g., level shifting operations), the drivers receive power and ground signals from the power and ground rails 2062-2068.

In some embodiments, the substrate 2080 of the second die 2060 includes the signal pads that are connected through TSVs to signal pads on the backside of the second die 2060. These backside signal pads are connected to external interconnects (e.g., micro bump arrays) that receive signals from and supply signals to external circuits outside of the 3D chip 2052. Through these backside signal pads, the signals pads on the front side of the second die substrate 2080 receive signals from external circuits for the I/O circuitry, and supply signals from the I/O circuitry to external circuits. One of ordinary skill will realize that other embodiments use other structures (e.g., copper pillars connected through interposers) to supply signals to the dies.

As shown, the second die 2060 includes the ESD circuits 2073 that are defined on its substrate, while the first die 2055 includes the drivers 2074 that are defined on its substrate. The ESD circuits are for maintaining signal stability inside of the chip. The ESD circuits are designed in some embodiments to dissipate quickly external irregular signal surges, in order to maintain signal stability inside of the chip. Each die 2055 or 2060 also includes decoupling capacitors that are for maintaining signal stability inside of the chip by eliminating signal noise from affecting signal quality on the chip.

The power or ground rail (I/O or core) on the top interconnect layer of each die has to provide its power signal or ground signal to the other die through the top interconnect layer of the other die. In some embodiments, this is done by having the power signal or ground signal traverse down one layer on the same die with one or more vias, traverse along interconnect lines on that layer, and then traverse back up along one or more vias to one or more pads on the top interconnect layer of its die. These pads have direct-bonded connections (e.g., DBI connections) to pads on the top interconnect layer of the other die. The pads on the other die then distribute to circuits on the other die the received power or ground signals through vias and interconnect lines. Also, between respective power and ground rails (e.g., I/O power and ground rails, or core power and ground rails), some embodiments define decoupling capacitors in the face-to-face mounted layer coupling the two dies, in order to suppress the effect of signal noise on the power supply.

In some embodiments, the core power and ground rails 2066 and 2068 respectively connect to interior power and ground lines on the same interconnect layers as the rails 2066 and 2068. These interior power and ground lines in some embodiments form an interior power mesh, such as the power mesh shown in either FIG. 9 or 10. Also, in some embodiments, the top interconnect layer of each die 2055 or 2060 has additional direct-bonded connections with the top interconnect layer of the other die in order to receive inputs for the I/O circuitry components (e.g., for the ESD circuits, drivers, etc.) from the other die, and to provide outputs from the I/O circuitry components (e.g., for the ESD circuits, drivers, etc.) to the other die.

In prior IC designs, the power/ground rails for the I/O circuitry and IC core are typically defined as four concentric rectangular rings that are placed on a single die along with the decoupling capacitors, drivers, and ESD circuits of the I/O circuitry. Placing these components on one die requires the I/O circuitry to consume a lot of area on the periphery of an IC die. This, in turn, leads to larger dies or leaves less space for the IC core. The 3D chip 2052, on the other hand, does not suffer these shortcomings as its I/O circuitry is split on the two dies 2055 and 2060. Also, by placing the power and ground rails (for the I/O and the core) on different dies, the 3D chip 2052 has far less area devoted to the power and ground rails, leaving more space to the circuits of the IC's core.

One of ordinary skill will understand that the 3D chip 2052 presents only one way by which the I/O circuits and power rails can be distributed among two vertically stacked (e.g., two face-to-face mounted dies). Other embodiments use other techniques to distribute the I/O circuits and power rails. For instance, in other embodiments, one I/O power rail is on the periphery of a top interconnect layer of a first die, while another I/O power rail is closer to the center of the top interconnect layer(s) of a second die vertically stacked (e.g., face-to-face mounted) with the first die. Still other embodiments define multiple stripes of I/O rails on the higher interconnect layers of two vertically stacked dies and then define multiple cores between different stripes. Accordingly, the architecture presented in FIG. 22B is only illustrative of how some embodiments distribute the I/O circuit and power rails between two vertically stacked dies.

Figure 21:
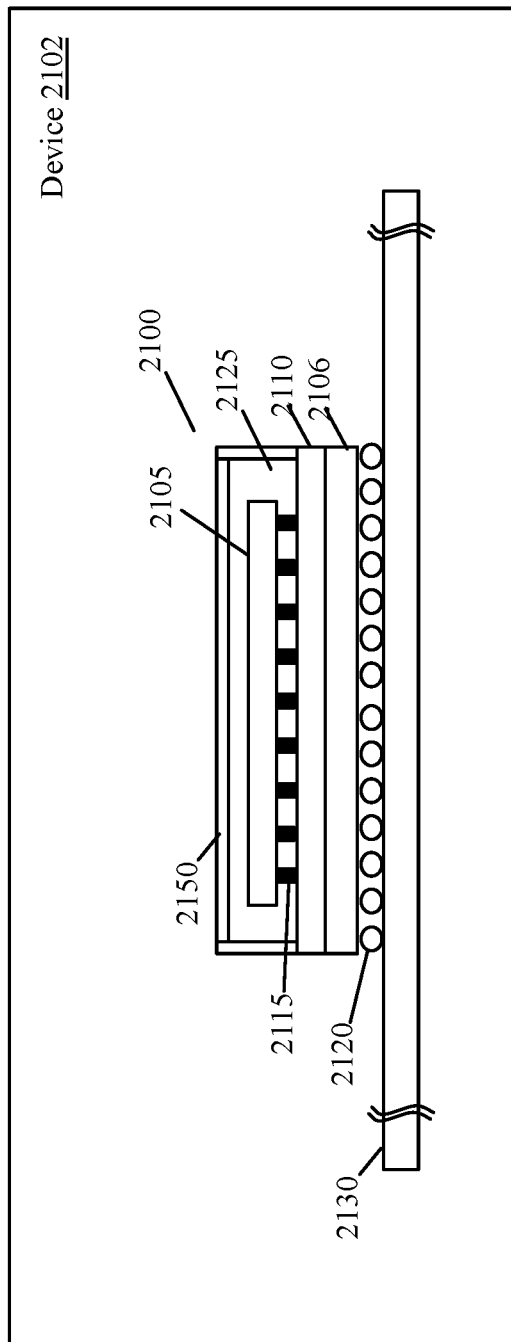
FIG. 21 illustrates a device that uses a 3D IC.

FIG. 21 illustrates a device 2102 that uses a 3D IC 2100 (like any of the 3D IC 100, 900-2000). In this example, the 3D IC 2100 is formed by two face-to-face mounted IC dies 2105 and 2110 that have numerous direct bonded connections 2115 between them. In other examples, the 3D IC 2100 includes three or more vertically stacked IC dies. As shown, the 3D IC die 2100 includes a cap 2150 that encapsulates the dies of this IC in a secure housing 2125. On the back side of the die 2110 one or more TSVs and/or interconnect layers 2106 are defined to connect the 3D IC to a ball grid array 2120 (e.g., a micro bump array) that allows this to be mounted on a printed circuit board 2130 of the device 2102. The device 2102 includes other components (not shown). In some embodiments, examples of such components include one or more memory storages (e.g., semiconductor or disk storages), input/output interface circuit(s), one or more processors, etc.

In some embodiments, the first and second dies 2105 and 2110 are the first and second dies shown in any of the FIGS. 1-20. In some of these embodiments, the second die 2110 receives power, clock and/or data bus signals through the ball grid array, and routes the received signals to shared power, clock and/or data bus lines on its shared interconnect layer(s), from where the received signals can be supplied to the interconnects/circuits of the first die through direct bonded connections between the first and second dies 2105 and 2110.

Figure 22:
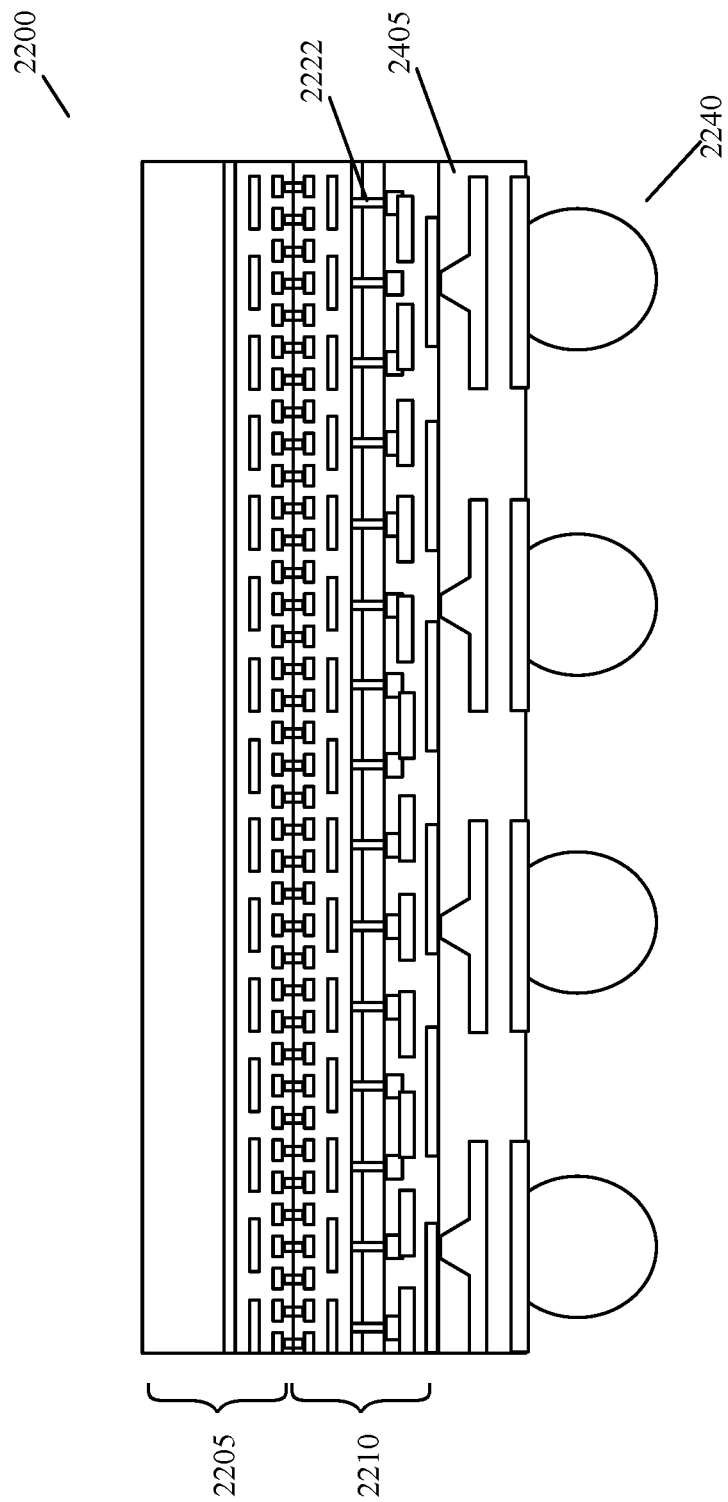
FIG. 22 provides an example of a 3D chip that is formed by two face-to-face mounted IC dies that are mounted on a ball grid array.

FIG. 22 provides another example of a 3D chip 2200 that is formed by two face-to-face mounted IC dies 2205 and 2210 that are mounted on a ball grid array 2240. In this example, the first and second dies 2205 and 2210 are face-to-face connected through direct bonded connections (e.g., DBI connections). As shown, several TSVs 2222 are defined through the second die 2210. These TSVs electrically connect to interconnects/pads on the backside of the second die 2210, on which multiple levels of interconnects are defined.

In some embodiments, the interconnects on the backside of the second die 2210 create the signal paths for defining one or more system level circuits for the 3D chip 2200 (i.e., for the circuits of the first and second dies 2205 and 2210). Examples of system level circuits are power circuits, clock circuits, data I/O signals, test circuits, etc. In some embodiments, the circuit components that are part of the system level circuits (e.g., the power circuits, etc.) are defined on the front side of the second die 2210. The circuit components can include active components (e.g., transistors, diodes, etc.), or passive/analog components (e.g., resistors, capacitors (e.g., decoupling capacitors), inductors, filters, etc.

In some embodiments, some or all of the wiring for interconnecting these circuit components to form the system level circuits are defined on interconnect layers on the backside of the second die 2210. Using these backside interconnect layers to implement the system level circuits of the 3D chip 2200 frees up one or more interconnect layers on the front side of the second die 2210 to share other types of interconnect lines with the first die 2205. The backside interconnect layers are also used to define some of the circuit components (e.g., decoupling capacitors, etc.) in some embodiments. As further described below, the backside of the second die 2210 in some embodiments can also connect to the front or back side of a third die.

In some embodiments, one or more of the layers on the backside of the second die 2210 are also used to mount this die to the ball grid array 2240, which allows the 3D chip 2100 to mount on a printed circuit board. In some embodiments, the system circuitry receives some or all of the system level signals (e.g., power signals, clock signals, data I/O signals, test signals, etc.) through the ball grid array 2240 connected to the backside of the third die.

In some embodiments, the backside of the second die 2210 of chip 2200 is used to define one or more interconnect layers on which power/ground lines are defined. For instance, in some embodiments, a first interconnect layer on the backside of the second die provides a first set of alternating power and ground lines, while a second interconnect layer on this backside provides another set of alternating power and ground lines. These two sets of alternating power/ground lines form a power mesh (similar the meshes described above by reference to FIGS. 9 and 10) as vias connect power lines in each set to power lines in the other set and ground lines in each set to ground lines in the other set.

The power/ground lines on such backside interconnect layer(s) are thicker and wider lines in some embodiments than the lines on the top interconnect layers on the front side(s) of the first and second dies 2205 and 2210. Gate stress is an undesirable side effect of having very thick power lines on the top interconnect layers on the front sides of the first and second dies. However, this is not an issue when placing thick (e.g., wide) power lines on the backside of IC dies. The thicker and wider power lines on the backside of the second die have less resistance (suffer less signal degradation) and are ideal for supplying additional power signals to the core circuits on the first and second dies. The circuits towards the center of a die can experience power signal degradation due to the power consumption of the circuits that are closer to the periphery of the die. Accordingly, in some embodiments, the power/ground lines on the backside of the second die is used in some embodiments to provide non-degraded power signals to the circuits that are closer to the middle of the first and second dies.

Alternatively to, or conjunctively with, defining the power/ground lines on the backside of the second die 2210, clock lines and/or data-bus lines are defined in some embodiments on the backside of the second die. Such clock lines and data-bus lines can be used to achieve analogous interconnect architectures to those described above by reference to FIGS. 11-20B. As the backside interconnects can be thicker and wider, the clock lines and data-bus lines can enjoy the same benefits as those described above for the power lines that are defined on the backside of the second die 2210. In some embodiments, the interconnect line widths on the backside of the second die 2210 are in the range of 1-10 microns, while the interconnect line widths on the interconnect layers on the front side of the first and second dies 2205 and 2210 are in the range of 1 microns or less.

Figure 23:
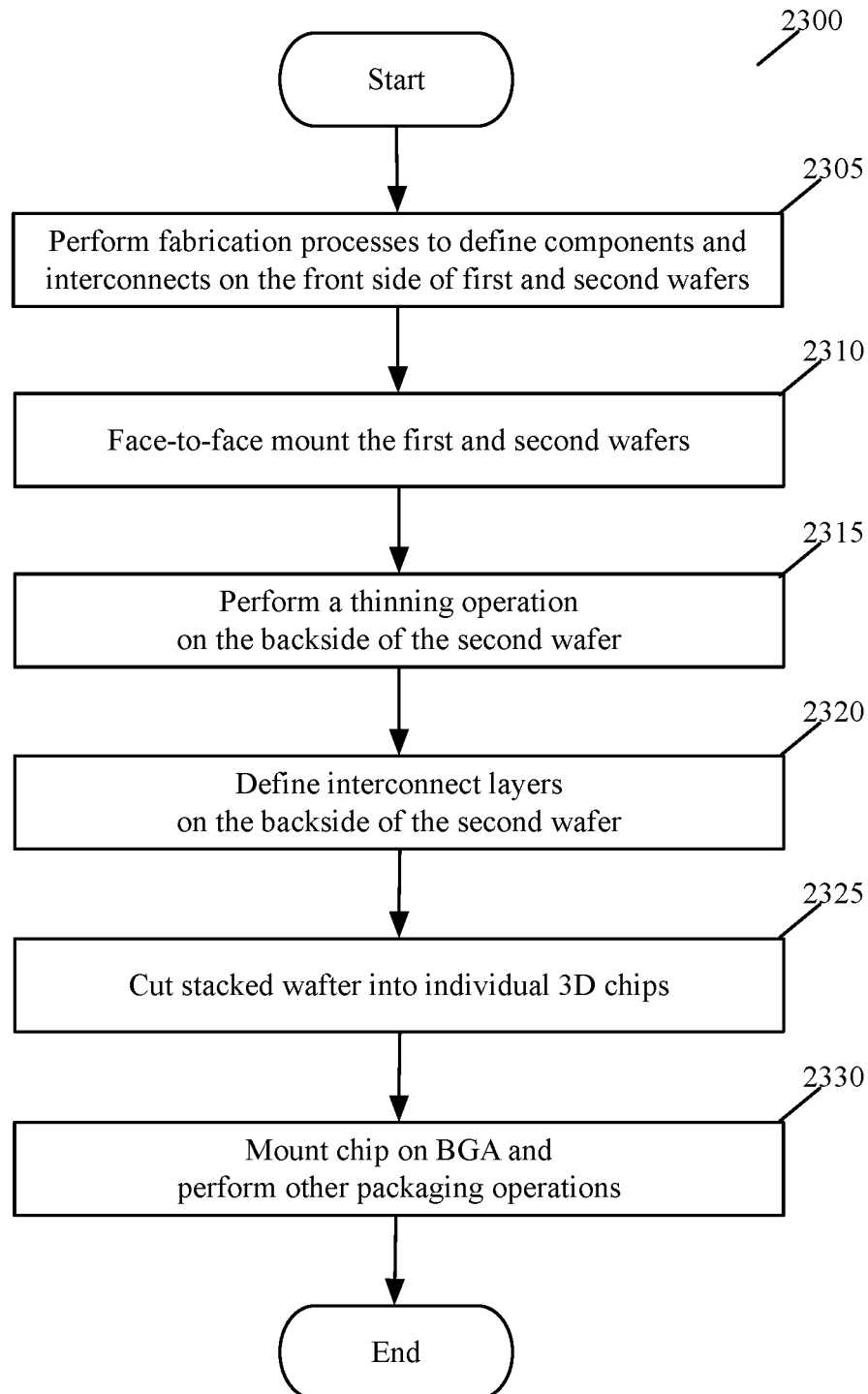
FIG. 23 illustrates a manufacturing process that some embodiments use to produce the 3D chip.

FIG. 23 illustrates a manufacturing process 2300 that some embodiments use to produce the 3D chip 2200 of FIG. 22. This figure will be explained by reference to FIGS. 24-27, which show two wafers 2405 and 2410 at different stages of the process. Once cut, the two wafers produce two stacked dies, such as dies 2205 and 2210. Even though the process 2300 of FIG. 23 cuts the wafers into dies after the wafers have been mounted and processed, the manufacturing process of other embodiments performs the cutting operation at a different stage at least for one of the wafers. Specifically, some embodiments cut the first wafer 2405 into several first dies that are each mounted on the second wafer before the second wafer is cut into individual second dies.

As shown, the process 2300 starts (at 2305) by defining components (e.g., transistors) on the substrates of the first and second wafers 2405 and 2410, and defining multiple interconnect layers above each substrate to define interconnections that form micro-circuits (e.g., gates) on each die. To define these components and interconnects on each wafer, the process 2300 performs multiple IC fabrication operations (e.g., film deposition, patterning, doping, etc.) for each wafer in some embodiments. FIG. 24 illustrates the first and second wafers 2405 and 2410 after several fabrication operations that have defined components and interconnects on these wafers. As shown, the fabrication operations for the second wafer 2410 defines several TSVs 2412 that traverse the interconnect layers of the second wafer 2410 and penetrate a portion of this wafer's substrate 2416.

After the first and second wafers have been processed to define their components and interconnects, the process 2300 face-to-face mounts (at 2310) the first and second wafers 2205 and 2210 through a direct bonding process, such as a DBI process. FIG. 25 illustrates the first and second wafers 2405 and 2410 after they have been face-to-face mounted through a DBI process. As shown, this DBI process creates a number of direct bonded connections 2426 between the first and second wafers 2405 and 2410.

Next, at 2315, the process 2300 performs a thinning operation on the backside of the second wafer 2410 to remove a portion of this wafer's substrate layer. As shown in FIG. 26, this thinning operation exposes the TSVs 2412 on the backside of the second wafer 2410. After the thinning operation, the process 2300 defines (at 2320) one or more interconnect layers 2430 the second wafer's backside. FIG. 27 illustrates the first and second wafers 2405 and 2410 after interconnect layers have been defined on the second wafer's backside.

These interconnect layers 2430 include one or more layers that allow the 3D chip stack to electrically connect to the ball grid array. In some embodiments, the interconnect lines/pads on the backside of the third wafer also produce one or more redistribution layers (RDL layers) that allow signals to be redistributed to different locations on the backside. The interconnect layers 2430 on the backside of the second die in some embodiments also create the signal paths for defining one or more system level circuits (e.g., power circuits, clock circuits, data I/O signals, test circuits, etc.) for the circuits of the first and second dies. In some embodiments, the system level circuits are defined by circuit components (e.g., transistors, etc.) that are defined on the front side of the second die. The process 2300 in some embodiments does not define interconnect layers on the backside of the second wafer to create the signal paths for the system level circuits, as it uses only the first and second dies' interconnect layers between their two faces for establishing the system level signal paths.

After defining the interconnect layers on the backside of the second wafer 2410, the process cuts (at 2325) the stacked wafers into individual chip stacks, with each chip stack include two stacked IC dies 2205 and 2210. The process then mounts (at 2330) each chip stack on a ball grid array and encapsulates the chip stack within one chip housing (e.g., by using a chip case). The process then ends.

Figure 28:
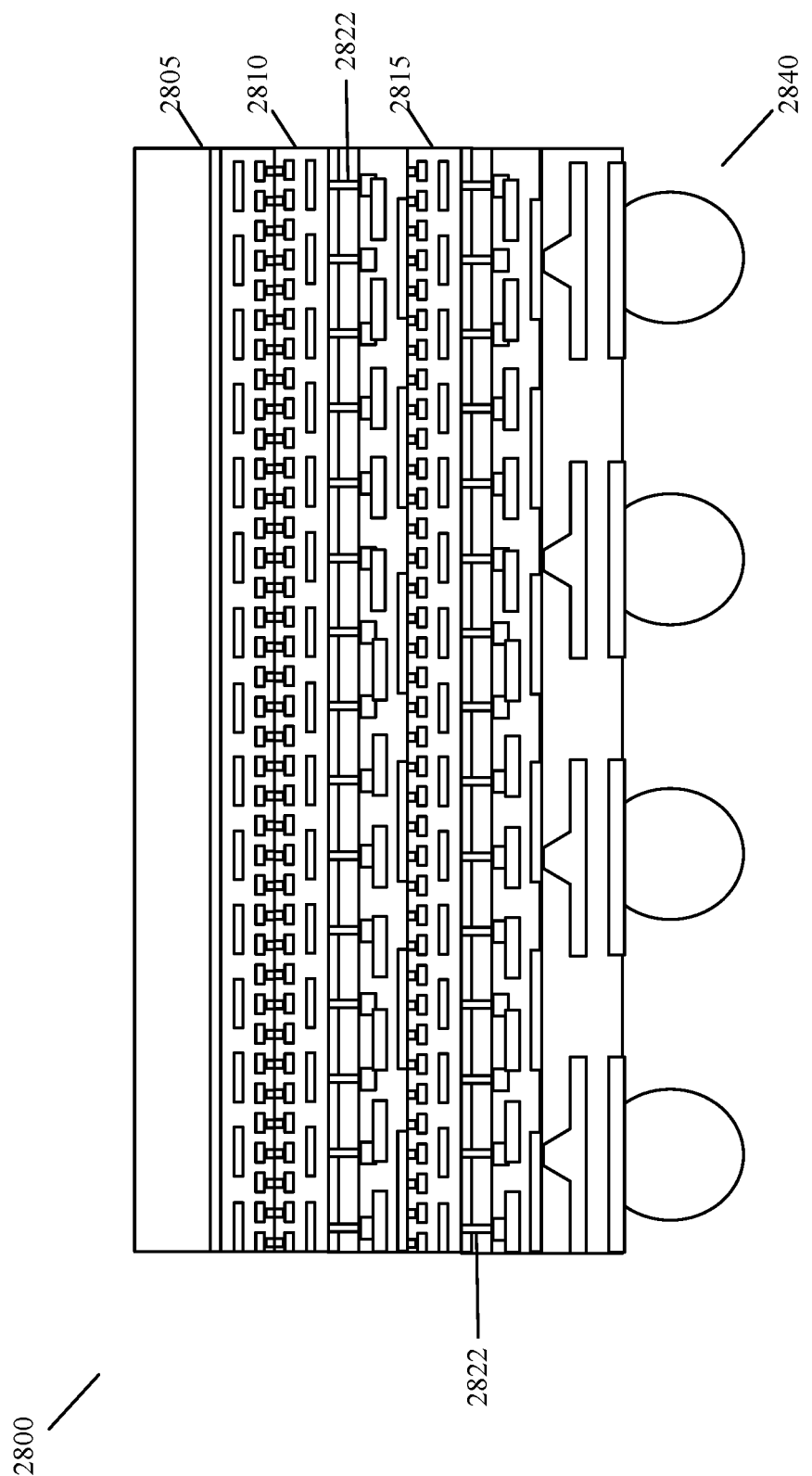
FIG. 28 illustrates an example of a 3D chip with three stacked IC dies.

In some embodiments, three or more IC dies are stacked to form a 3D chip. FIG. 28 illustrates an example of a 3D chip 2800 with three stacked IC dies 2805, 2810 and 2815. In this example, the first and second dies 2805 and 2810 are face-to-face connected through direct bonded connections (e.g., DBI connections), while the third and second dies 2815 and 2810 are face-to-back connected (e.g., the face of the third die 2815 is mounted on the back of the second die 2810). In some embodiments, the first and second dies 2805 and 2810 are the first and second dies shown in any of the FIGS. 1-20.

In FIG. 28, several TSVs 2822 are defined through the second die 2810. These TSVs electrically connect to interconnects/pads on the backside of the second die 2810, which connect to interconnects/pads on the top interconnect layer of the third die 2815. The third die 2815 also has a number of TSVs that connect signals on the front side of this die to interconnects/pads on this die's backside. Through interconnects/pads, the third die's backside connects to a ball grid array 2840 that allows the 3D chip 2800 to mount on a printed circuit board.

In some embodiments, the third die 2815 includes system circuitry, such as power circuits, clock circuits, data I/O circuits, test circuits, etc. The system circuitry of the third die 2815 in some embodiments supplies system level signals (e.g., power signals, clock signals, data I/O signals, test signals, etc.) to the circuits of the first and second dies 2805 and 2810. In some embodiments, the system circuitry receives some or all of the system level signals through the ball grid array 2840 connected to the backside of the third die.

Figure 29:
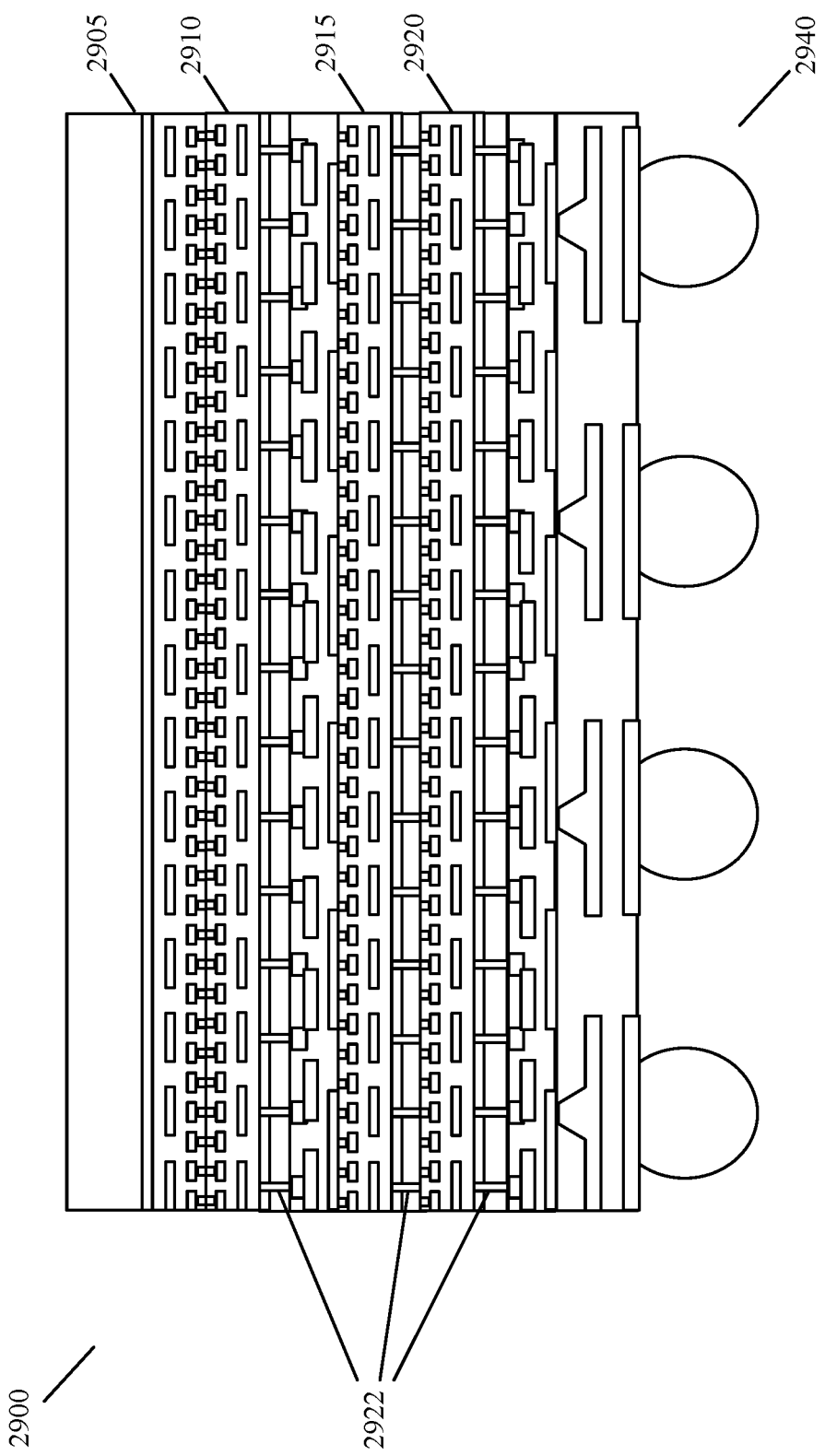
FIG. 29 illustrates an example of a 3D chip with four stacked IC dies.

FIG. 29 illustrates another example of a 3D chip 2900 with more than two stacked IC dies. In this example, the 3D chip 2900 has four IC dies 2905, 2910, 2915 and 2920. In this example, the first and second dies 2905 and 2910 are face-to-face connected through direct bonded connections (e.g., DBI connections), while the third and second dies 2915 and 2910 are face-to-back connected (e.g., the face of the third die 2915 is mounted on the back of the second die 2910) and the fourth and third dies 2920 and 2915 are face-to-back connected (e.g., the face of the fourth die 2920 is mounted on the back of the third die 2915). In some embodiments, the first and second dies 2905 and 2910 are the first and second dies shown in any of the FIGS. 1-20.

In FIG. 29, several TSVs 2922 are defined through the second, third and fourth die 2910, 2915 and 2920. These TSVs electrically connect to interconnects/pads on the backside of these dies, which connect to interconnects/pads on the top interconnect layer of the die below or the interconnect layer below. Through interconnects/pads and TSVs, the signals from outside of the chip are received from the ball grid array 2940.

Other embodiments use other 3D chip stacking architectures. For instance, instead of face-to-back mounting the fourth and third dies 2920 and 2915 in FIG. 29, the 3D chip stack of another embodiment has these two dies face-to-face mounted, and the second and third dies 2910 and 2915 back-to-back mounted. This arrangement would have the third and fourth dies 2915 and 2920 share a more tightly arranged set of interconnect layers on their front sides.

While the invention has been described with reference to numerous specific details, one of ordinary skill in the art will recognize that the invention can be embodied in other specific forms without departing from the spirit of the invention. For instance, one of ordinary skill will understand that even though several H-trees were described above as example of clock distribution networks, other embodiments use other types of clock distribution networks. Also, in some embodiments, the stacked dies in a 3D chip share multiple different clock trees on multiple shared interconnect layers in order to distribute multiple different clock signals (e.g., to distribute a different clock signal with each different shared clock tree).

In the examples illustrated in FIG. 1-20, a first IC die is shown to be face-to-face mounted with a second IC die. In other embodiments, the first IC die is face-to-face mounted with a passive interposer that electrically connects the die to circuits outside of the 3D chip or to other dies that are face-to-face mounted or back-to-back mounted on the interposer. In some of these embodiments, the passive interposer can include the power, clock, and/or data bus interconnect line architectures that were described in FIGS. 1-20 for the second dies in these examples. In other words, the interposer can provide the interconnect layers for establishing the power, clock and data-bus lines of the 3D chip.

In some embodiments, the preferred wiring directions of the top layer of the interposer is orthogonal to the preferred wiring directions of the top layer of the first die. This can be achieved by using similar techniques to those described above by reference to FIGS. 6-8. Some embodiments place a passive interposer between two faces of two dies. Some embodiments use an interposer to allow a smaller die to connect to a bigger die.

Figure 30:
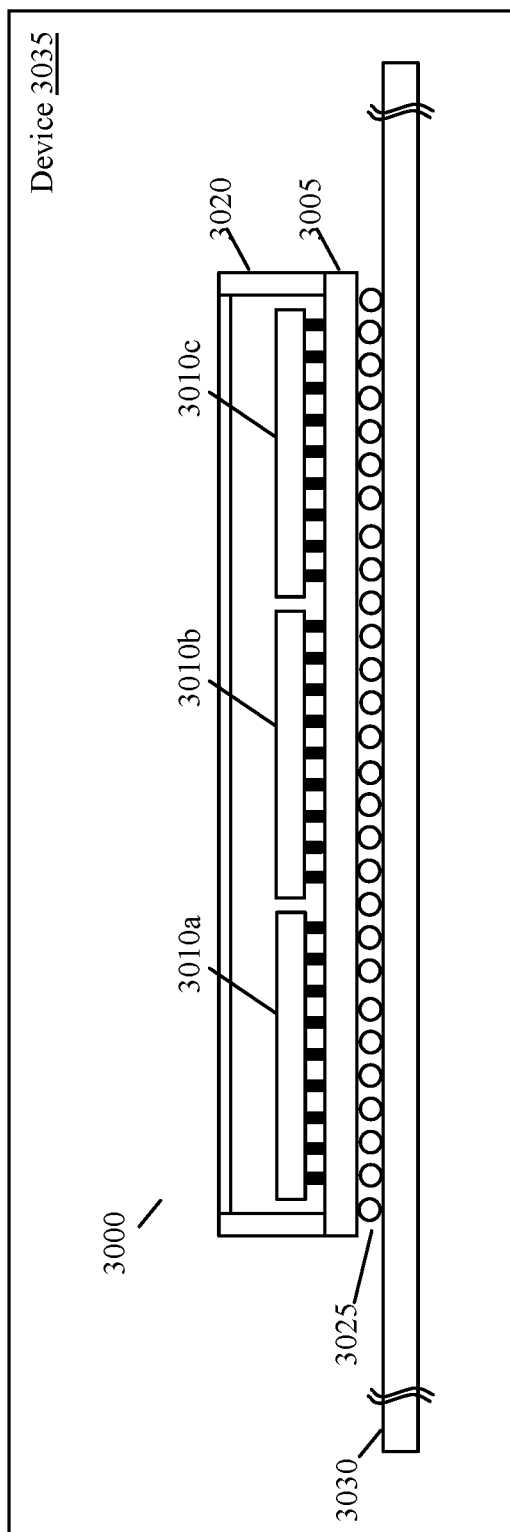
FIG. 30 illustrates a 3D chip that is formed by face-to-face mounting three smaller dies on a larger die.

Also, the 3D circuits and ICs of some embodiments have been described by reference to several 3D structures with vertically aligned IC dies. However, other embodiments are implemented with a myriad of other 3D structures. For example, in some embodiments, the 3D circuits are formed with multiple smaller dies placed on a larger die or wafer. FIG. 30 illustrates one such example. Specifically, it illustrates a 3D chip 3000 that is formed by face-to-face mounting three smaller dies 3010a-c on a larger die 3005. All four dies are housed in one chip 3000 by having one side of this chip encapsulated by a cap 3020, and the other side mounted on a micro-bump array 3025, which connects to a board 3030 of a device 3035. Some embodiments are implemented in a 3D structure that is formed by vertically stacking two sets of vertically stacked multi-die structures.

The invention claimed is:
1. A three-dimensional (3D) circuit comprising:
   a first integrated circuit (IC) die comprising a first semiconductor substrate and a first set of interconnect layers defined on the first semiconductor substrate; and
   a second IC die vertically stacked with the first IC die and comprising a second semiconductor substrate and a second set of interconnect layers defined on the second semiconductor substrate, wherein at least one particular second-set interconnect layer comprising a plurality of interconnect segments for supplying clock signals to the first IC die.

2. The 3D circuit of claim 1, wherein each IC die comprises a plurality of transistors and a plurality of circuit elements formed by interconnecting sets of transistors with a set of interconnect segments on that die's set of interconnect layers.

3. The 3D circuit of claim 1, wherein the second IC die comprises a clock circuit that provides clock signals to circuits on the first IC die through the particular second-set interconnect layer of the second die and connections between the first and second sets of interconnect layers.

4. The 3D circuit of claim 1 further comprising a bonding layer that bonds the first and second sets of interconnect layers, and a plurality of connections that cross the bonding layer to supply clock signals from the particular second-set interconnect layer to the first IC die.

5. The 3D circuit of claim 4, wherein a set of at least 1000 connections/mm$^2$ cross the bonding layer to allow signals to traverse between the first and second IC dies, and each of a subset of the connections carries a clock signal.

6. The 3D circuit of claim 4, wherein a set of at least 10000 connections/mm$^2$ cross the bonding layer to allow signals to traverse between the first and second IC dies, and each of a subset of the connections carries a clock signal.

7. The 3D circuit of claim 4, wherein a set of at least 100000 connections/mm$^2$ cross the bonding layer to allow signals to traverse between the first and second IC dies, and each of a subset of the connections carries a clock signal.

8. The 3D circuit of claim 4, wherein a set of at least 1000000 connections/mm$^2$ cross the bonding layer to allow signals to traverse between the first and second IC dies, and each of a subset of the connections carries a clock signal.

9. The 3D circuit of claim 4, wherein a center-to-center pitch between two neighboring connections in each of a plurality of neighboring connections that cross the bonding layer is 15 µm or less.

10. The 3D circuit of claim 4, wherein a center-to-center pitch between two neighboring connections in each of a plurality of neighboring connections that cross the bonding layer is 5 µm or less.

11. The 3D circuit of claim 4, wherein a center-to-center pitch between two neighboring connections in each of a plurality of neighboring connections that cross the bonding layer is 0.5 µm or less.

12. The 3D circuit of claim 4, wherein the first and second dies are face-to-face mounted through a direct bonding process, wherein at least a subset of direct bonded connections that supply a clock signal from the second die to the first die are shorter than 1 micron.

13. The 3D circuit of claim 12, wherein the direct bonding process is a DBI (Direct Bond Interconnect) process.

14. The 3D circuit of claim 1, wherein the second-set interconnect layers include at least a subset of clock interconnects that are part of a clock distribution network shared by the first and second dies.

15. The 3D circuit of claim 14, wherein the clock distribution network is formed by a plurality of interconnect layers in the second set of interconnect layers.

16. The 3D circuit of claim 15, wherein the plurality of interconnect layers in the second set of interconnect layers that form the clock distribution network comprise a plurality of horizontal or vertical interconnect lines that form a clock tree.

17. The 3D circuit of claim 16, wherein the clock tree is a hierarchical H-tree.

18. The 3D circuit of claim 14, wherein the clock distribution network is a clock mesh formed by horizontal or vertical interconnect lines on an interconnect layer of each of the first and second sets of interconnect layers of the first and second dies.

19. The 3D circuit of claim 18, wherein the clock tree is a hierarchical H-tree.

20. The 3D circuit of claim 18 further comprising:
a bonding layer that bonds the first and second sets of interconnect layers; and
a plurality of connections that cross the bonding layer to supply clock signals from the particular second-set interconnect layer to the first IC die;
wherein the clock tree comprises a plurality of the connections that cross the bonding layer to connect corresponding clock interconnect lines on each die.

21. The 3D circuit of claim 20, wherein the clock-tree connections are direct bonded interconnects.

22. The 3D circuit of claim 20, wherein the clock-tree connections are via connections that cross the bonding layer to establish connections between corresponding clock interconnect lines on each die.

23. The 3D circuit of claim 1 further comprising a third IC die that is vertically stacked with the first and second dies and that receives a clock signal carried by at least one interconnect segment on the particular second-set interconnect layer.

24. The 3D circuit of claim 1, wherein
the particular second-set interconnect layer is a top interconnect layer of the second die on which thicker and wider interconnect segments are defined, and
the thicker and wider interconnect segments have lower resistance and suffer less signal degradation, thereby allowing a clock signal to be driven a longer distance with no or less clock signal regeneration.

* * * * *